(12) United States Patent
Terada et al.

(10) Patent No.: US 8,048,690 B2
(45) Date of Patent: *Nov. 1, 2011

(54) PRESSURE-SENSITIVE ADHESIVE SHEET AND PROCESS FOR PRODUCING SEMICONDUCTOR DEVICE HAVING SAME

(75) Inventors: Yoshio Terada, Ibaraki (JP); Fumiteru Asai, Ibaraki (JP); Hirokuni Hashimoto, Ibaraki (JP)

(73) Assignee: Nitto Denko Corporation, Shimohozumi, Ibaraki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/513,316

(22) PCT Filed: Oct. 9, 2008

(86) PCT No.: PCT/JP2008/068340
§ 371 (c)(1),
(2), (4) Date: May 1, 2009

(87) PCT Pub. No.: WO2009/060687
PCT Pub. Date: May 14, 2009

(65) Prior Publication Data
US 2011/0065217 A1    Mar. 17, 2011

(30) Foreign Application Priority Data

Nov. 8, 2007  (JP) .................. 2007-291248
Nov. 8, 2007  (JP) .................. 2007-291251
Nov. 8, 2007  (JP) .................. 2007-291254
Nov. 14, 2007 (JP) .................. 2007-295526

(51) Int. Cl.
   *H01L 21/00*    (2006.01)

(52) U.S. Cl. ............... 438/15; 438/17; 257/E21.531; 257/E23.092; 257/E23.107

(58) Field of Classification Search .............. 438/15–17; 257/E21.531, 23.092, 107
See application file for complete search history.

(56) References Cited

U.S. PATENT DOCUMENTS

| | | | | |
|---|---|---|---|---|
| 5,695,847 A | * | 12/1997 | Browne | 428/112 |
| 6,333,466 B1 | * | 12/2001 | Miyaake et al. | 174/254 |
| 6,344,155 B1 | | 2/2002 | Kitahara et al. | |

(Continued)

FOREIGN PATENT DOCUMENTS

JP    52-006465    1/1977

(Continued)

OTHER PUBLICATIONS

International Search Report issued on the corresponding PCT Application No. PCT/JP2008/068340, dated Jan. 27, 2009.

(Continued)

*Primary Examiner* — Michael Lebentritt
(74) *Attorney, Agent, or Firm* — Knobbe Martens Olson & Bear LLP

(57) ABSTRACT

A pressure-sensitive adhesive sheet according to the present invention is a pressure-sensitive adhesive sheet in which a pressure-sensitive adhesive layer is provided on a base film, in which the base film contains conductive fibers, and in which an electrically conductive path is formed between the pressure-sensitive adhesive layer and the base film. With this structure, an electrical continuity test can be performed even in a condition where a semiconductor wafer or a semiconductor chip formed by dicing the semiconductor wafer is applied, and deformation (warping) and damage of the semiconductor wafer and generation of flaws and scratches on the backside can be prevented in the test.

23 Claims, 5 Drawing Sheets

U.S. PATENT DOCUMENTS

| | | | |
|---|---|---|---|
| 6,617,018 B2 * | 9/2003 | Tamai et al. | 428/328 |
| 2002/0149829 A1 * | 10/2002 | Mochizuka et al. | 359/265 |
| 2005/0178496 A1 * | 8/2005 | Aisenbrey | 156/244.11 |
| 2009/0029125 A1 * | 1/2009 | Nakahira | 428/209 |
| 2010/0313667 A1 * | 12/2010 | Terada et al. | 73/754 |
| 2010/0323191 A1 * | 12/2010 | Sugo et al. | 428/332 |

FOREIGN PATENT DOCUMENTS

| | | |
|---|---|---|
| JP | 60-102750 | 6/1985 |
| JP | 4-070937 | 3/1992 |
| JP | 7-294585 | 11/1995 |
| JP | 11-080682 | 3/1999 |
| JP | 2000-290616 | 10/2000 |
| JP | 2003-020462 | 1/2003 |
| JP | 2005-263876 | 9/2005 |

OTHER PUBLICATIONS

International Search Report issued on the related PCT Application No. PCT/JP2008/068338, dated Jan. 20, 2009.

* cited by examiner

[Fig. 1]
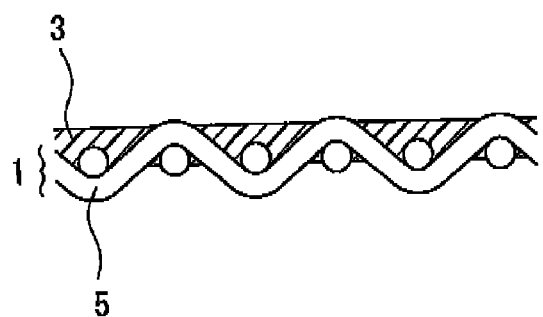
[Fig. 2]
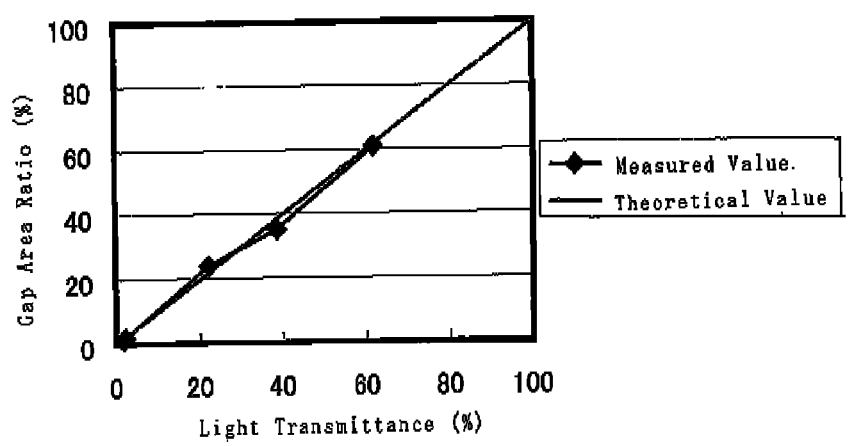

[Fig. 3]
(a)
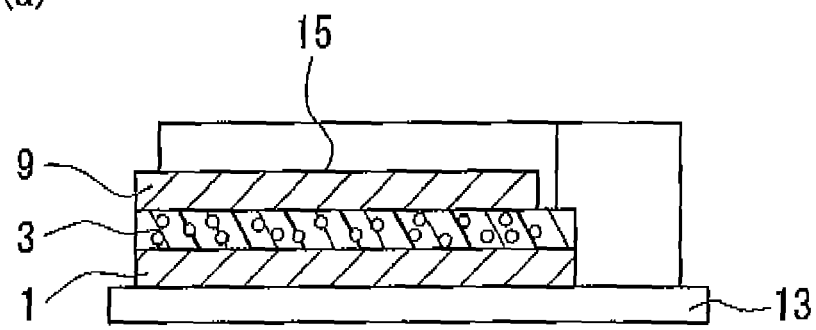
(b)
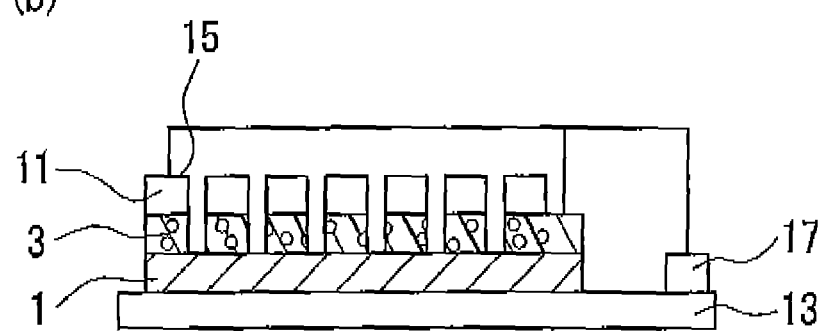

[Fig. 4]
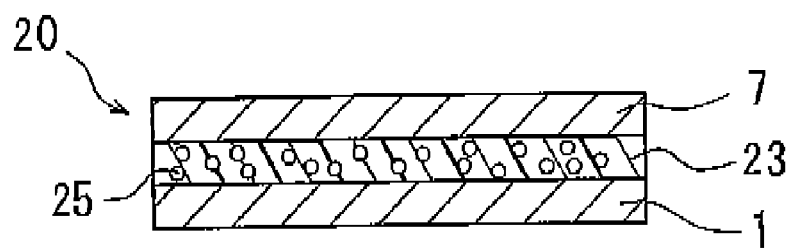
[Fig. 5]
(a)
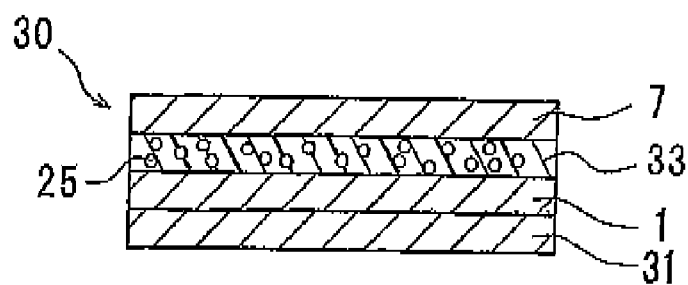
(b)
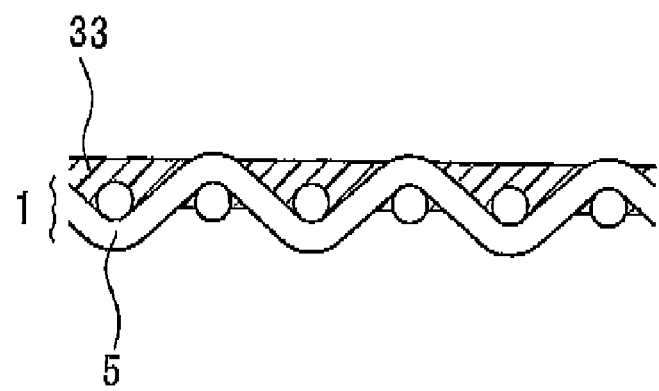

[Fig. 6]
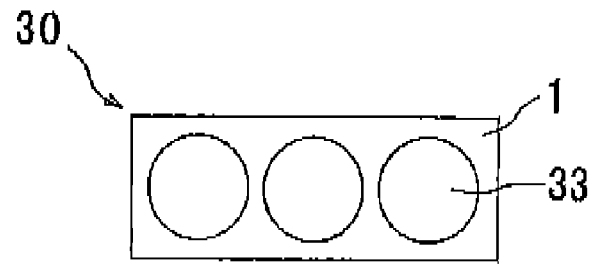
[Fig. 7]
(a)
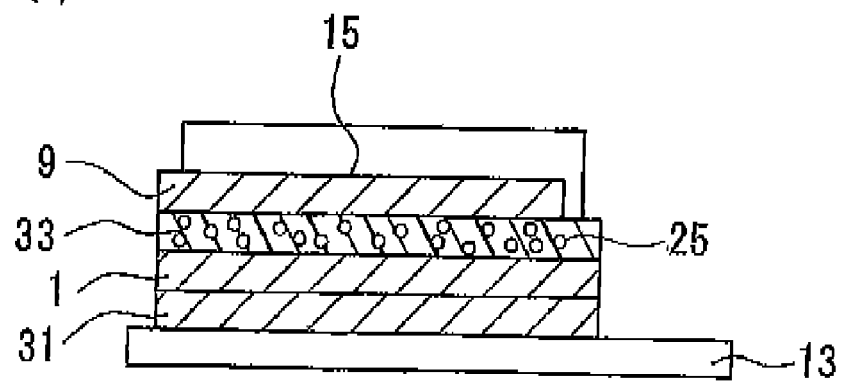
(b)
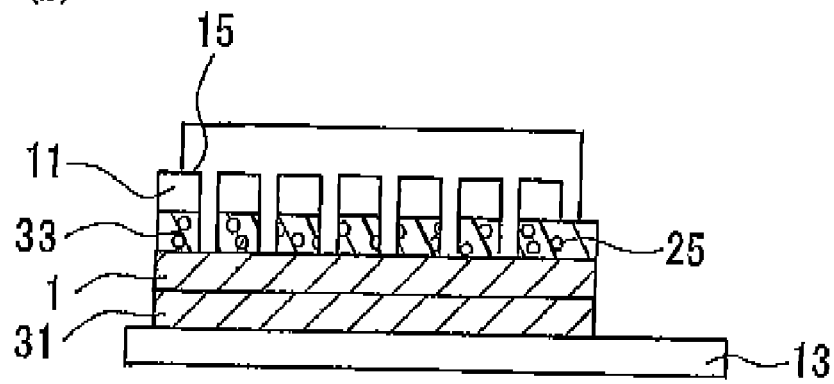

[Fig. 8]
(a)
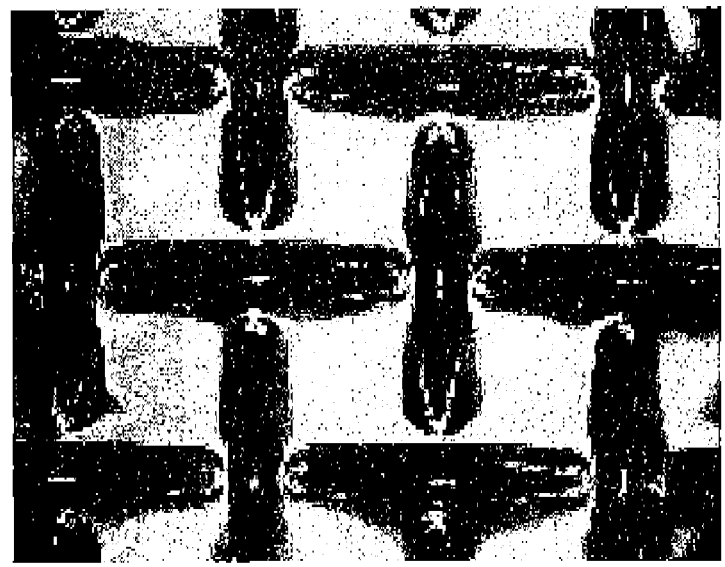
(b)
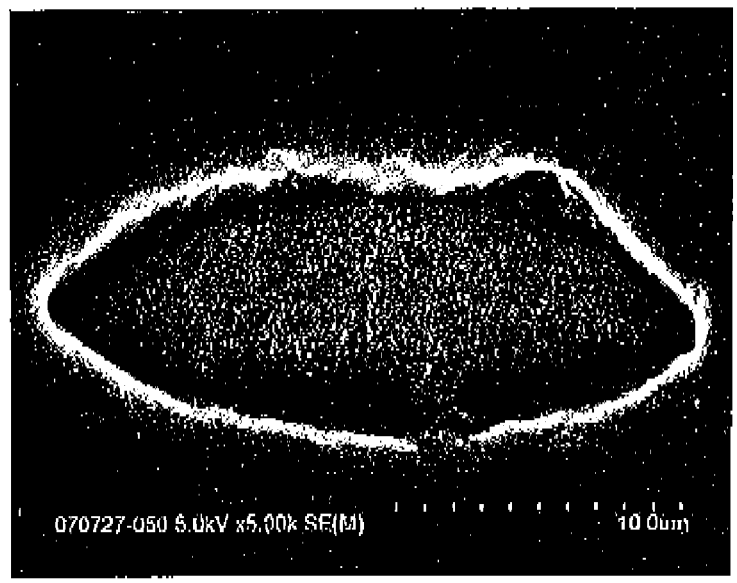

PRESSURE-SENSITIVE ADHESIVE SHEET AND PROCESS FOR PRODUCING SEMICONDUCTOR DEVICE HAVING SAME

This application is the U.S. National Phase under 35 U.S.C. §371 of International Application No. PCT/JP2008/068340, filed Oct. 9, 2008, which claims priority to Japanese Patent Applications No. 2007-291248, filed Nov. 8, 2007, No. 2007-291251, filed Nov. 8, 2007, No. 2007-291254, filed Nov. 8, 2007, and No. 2007-295526, filed Nov. 14, 2007. The International Application has not been published in English under PCT Article 21(2).

TECHNICAL FIELD

The present invention relates to a pressure-sensitive adhesive sheet for testing and a method of manufacturing a semiconductor device using the same. The pressure-sensitive adhesive sheet for testing of the present invention is a pressure-sensitive adhesive sheet for performing a continuity test in a condition where a semiconductor wafer or a semiconductor chip is applied, and it is particularly useful as a pressure-sensitive adhesive sheet that is capable of allowing a dicing step and a picking up step to be performed continuously.

BACKGROUND ART

Conventionally, a semiconductor wafer having silicon, gallium, arsenic, and the like as a material is subjected to a continuity test in a testing step after being manufactured in a condition of having a large diameter. After that, the semiconductor wafer is applied onto a pressure-sensitive adhesive sheet for dicing, and each step of a dicing step, a cleaning step, an expanding step, a picking up step, and a mounting step is performed. An example of the pressure-sensitive adhesive sheet for dicing is one in which a pressure-sensitive adhesive layer made of an acrylic pressure-sensitive adhesive or the like is applied and formed onto a base material of a plastic film (for example, see Patent Document 1).

However, in recent years, semiconductor wafers have become increasingly thin with the spread of IC cards and the like, and because of that, there arises a problem that a semiconductor wafer is deformed (warped) or damaged in the testing step or in the step of applying the wafer onto a pressure-sensitive adhesive sheet for dicing. As a result, it is difficult to steadily handle the semiconductor wafer in these steps Further, in the case of placing a thin semiconductor wafer onto a stage for the continuity test, there are problems such as flaws and scratches being generated on the backside of the semiconductor wafer and damage (cracks) of the semiconductor wafer being generated by foreign substances, particles, and the like on the stage.

[Patent Document 1] Japanese Examined Patent Publication No. 04-070937

DISCLOSURE OF THE INVENTION

Problems To Be Solved By the Invention

The present invention is performed in view of the above-described problems, and an object of the invention is to provide a pressure-sensitive adhesive sheet for testing that is capable of allowing an electrical continuity test to be performed even in a condition where a semiconductor wafer or a semiconductor chip formed by dicing the semiconductor wafer is applied and that is capable of preventing in the test deformation (warp) and damage of the semiconductor wafer and flaws and scratches from being generated on the backside, and a method of manufacturing a semiconductor device using the pressure-sensitive adhesive sheet for testing.

Means For Solving the Problems

The present inventors made a study on a pressure-sensitive adhesive sheet for testing and a method of manufacturing a semiconductor device using the sheet to solve the above-described conventional problems. As a result, the inventors found that the continuity test of a semiconductor wafer or a semiconductor chip becomes possible in a condition where it is fixed to the pressure-sensitive adhesive sheet by using a pressure-sensitive adhesive sheet for testing that includes conductive base film and pressure-sensitive adhesive layer, and completed the present invention.

That is, in order to solve the problems, the pressure-sensitive adhesive sheet for testing according to the present invention is a pressure-sensitive adhesive sheet wherein a base film, and a pressure-sensitive adhesive layer provided on the base film, wherein the base film contains a conductive fiber and an electrically conductive path is formed between the pressure-sensitive adhesive layer and the base film.

It is also preferable that a portion of the conductive fiber constituting the base film is exposed from a surface of the pressure-sensitive adhesive layer, and the electrically conductive path is formed between the surface of the pressure-sensitive adhesive layer and the base film.

The pressure-sensitive adhesive sheet having the above-described configuration is suitable as a pressure-sensitive adhesive sheet for dicing. With this configuration, because a portion of the conductive fibers constituting the base film is exposed from the surface of the pressure-sensitive adhesive layer, conduction of current is not inhibited by a nonconductive pressure-sensitive adhesive layer. As a result, it becomes possible to secure an electrically conductive path between the surface of the pressure-sensitive adhesive layer and the base film.

With the pressure-sensitive adhesive sheet for dicing having such a configuration, a test related to conduction can be carried out even in a condition where the semiconductor wafer or the semiconductor chip formed by dicing is fixed (including a temporary fixing). That is, the conductive path is not secured in a conventional pressure-sensitive adhesive sheet for dicing because it is not assumed to perform a continuity test on the semiconductor wafer in a condition where the pressure-sensitive adhesive sheet is applied thereto. Because of that, it is difficult to perform a continuity test on the semiconductor wafer. However, because a portion of the conductive fibers constituting the base film is exposed from the surface of the pressure-sensitive adhesive layer in the pressure-sensitive adhesive sheet for dicing of the present invention, the semiconductor wafer directly contacts the conductive base film. Therefore, a continuity test becomes possible in a condition where the semiconductor wafer is applied. Further, in the case of performing dicing on the semiconductor wafer, the dicing may cut and separate not only the semiconductor wafer but also the pressure sensitive adhesive layer. However, even in such a case, the electrically conductive path is secured in the pressure-sensitive adhesive sheet for dicing of the present invention because the base film and the semiconductor chip directly contact each other. Therefore, a continuity test on the semiconductor chip after dicing becomes possible.

It is also preferable that the aperture of the base film is 10% or more.

It is also preferable that the tensile modulus of the pressure-sensitive adhesive layer before being formed on the base film is 0.2 MPa or less.

It is also preferable that a conductive particle is contained in the pressure-sensitive adhesive layer.

The pressure-sensitive adhesive sheet having the above-described configuration is suitable as a pressure-sensitive adhesive sheet for dicing. With this configuration, because conductive particles are contained in the pressure-sensitive adhesive layer, conductivity can be exhibited in any direction within the surface, the thickness direction, and the like. Further, because the base film also contains conductive fibers, conductivity is exhibited in any direction within the surface, the thickness direction, and the like. In this manner, it becomes possible to form the electrically conductive path between the pressure-sensitive adhesive layer and the base film.

With the pressure-sensitive adhesive sheet for dicing having such a configuration, a test related to conduction can be carried out even in a condition where the semiconductor wafer or the semiconductor chip formed by dicing is fixed (including a temporary fixing). That is, the conductive path is not secured in a conventional pressure-sensitive adhesive sheet for dicing because it is not assumed to perform a continuity test of the semiconductor wafer in a condition where the pressure-sensitive adhesive sheet is applied thereto. Because of that, it is difficult to perform the continuity test on the semiconductor wafer. However, because the base film and the pressure-sensitive adhesive layer are conductive in the pressure-sensitive adhesive sheet for dicing of the present invention, the conductive path is secured. As a result, a continuity test becomes possible in a condition where the semiconductor wafer is applied. Further, in the case of performing dicing on the semiconductor wafer, the dicing may cut and separate not only the semiconductor wafer but also the pressure sensitive adhesive layer. However, even in such a case, it becomes possible to perform a continuity test on the semiconductor chip after dicing with the pressure-sensitive adhesive sheet for dicing of the present invention because the electrically conductive path is secured between the pressure-sensitive adhesive layer and the base film.

It is also preferable that the content of the conductive particle is in a range of 1 to 500 parts by weight with respect to a base polymer 100 parts by weight.

It is also preferable that the surface resistivity of the pressure-sensitive adhesive layer is 5Ω/☐ or less.

It is also preferable that the surface resistivity of the base film is 1Ω/☐ or less.

It is also preferable that the pressure-sensitive adhesive layer is a radiation curing-type pressure-sensitive adhesive layer.

It is also preferable that the base film and the pressure-sensitive adhesive layer are laminated one by one onto a support, and the tensile modulus of the support at 23° C. is 500 MPa or less.

The pressure-sensitive adhesive sheet having the above-described configuration is suitable as a pressure-sensitive adhesive sheet for testing. With this configuration, because the electrically conductive path is provided between the pressure-sensitive adhesive layer and the base film, a test related to conduction can be carried out in a condition where the semiconductor wafer or the semiconductor chip formed by dicing is fixed (including a temporary fixing). That is the conductive path is not secured in a conventional pressure-sensitive adhesive sheet for testing because it is not assumed to perform a continuity test on the semiconductor wafer in a condition where the pressure-sensitive adhesive sheet is applied thereto. Because of that, it is difficult to perform a continuity test on the semiconductor wafer. However, because the conductive path is not secured between the pressure-sensitive adhesive layer and the base film in the pressure-sensitive adhesive sheet for testing of the present invention, it becomes possible to perform a continuity test in a condition where the semiconductor wafer is applied. Further, because the pressure-sensitive adhesive layer can fix the semiconductor wafer, the pressure-sensitive adhesive sheet for testing of the present invention functions also as the pressure-sensitive adhesive sheet for dicing. Further, not only the semiconductor wafer but also the pressure-sensitive adhesive layer may be cut and separated in dicing. However, even in such a case, it becomes possible to perform a continuity test on the semiconductor chip after dicing with the pressure-sensitive adhesive sheet for testing of the present invention because the electrically conductive path is secured between the pressure-sensitive adhesive layer and the base film.

Further, the tensile modulus of the support (23° C.) is 500 MPa or less, and the support is superior in flexibility compared with the base film containing conductive fibers. As a result, excellent stretchability is exhibited in expanding and thrusting with a needle for picking up the semiconductor chip. In this manner, the pressure-sensitive adhesive sheet for testing of the present invention can be used also in an expanding step and a pick-up step and shows a good expanding property and pick-up property.

The conductive particles are preferably contained in the pressure-sensitive adhesive layer. With this configuration, because conductive particles are contained in the pressure-sensitive adhesive layer, conductivity can be exhibited in any direction within the surface, the thickness direction, and the like. Further, because the base film also contains conductive fibers, conductivity is exhibited in any direction within the surface, the thickness direction, and the like. In this manner, formation of the electrically conductive path becomes possible between the pressure-sensitive adhesive layer and the base film.

A portion of the conductive fibers is preferably exposed from the surface of the pressure-sensitive adhesive layer. With this configuration, because a portion of the conductive fibers constituting the base film is exposed from the surface of the pressure-sensitive adhesive layer, conduction of current is not inhibited by a nonconductive pressure-sensitive adhesive layer. As a result, it becomes possible to secure an electrically conductive path between the surface of the pressure-sensitive adhesive layer and the base film.

It is also preferable that another pressure-sensitive adhesive layer is provided between the support and the base film.

It is also preferable that the support has a structure in which another pressure-sensitive adhesive layer is provided on a base material.

It is also preferable that the maximum elongation of the support is 100% or more.

In order to solve the above-described problems, a method of manufacturing a semiconductor device according to the present invention includes the steps of applying a semiconductor wafer onto the pressure-sensitive adhesive layer in the pressure-sensitive adhesive sheet according to any one of claims 1 to 9 with a surface opposite a circuit forming surface as an application surface, performing a continuity test on the semiconductor wafer through establishment of an electrical connection by placing the pressure-sensitive adhesive sheet onto a conductive testing stage in a condition where the semiconductor wafer is fixed and by contacting one connection terminal to the circuit forming surface of the semiconductor wafer and contacting another connection terminal to the pressure-sensitive adhesive layer or the continuity testing stage, forming a semiconductor chip in a condition where at least a portion of the base film is left by dicing the semiconductor wafer from the circuit forming surface side, and picking up the semiconductor chip from the pressure-sensitive adhesive sheet.

In the pressure-sensitive adhesive sheet that is suitable as the above-described pressure-sensitive adhesive sheet for dicing, because the electrically conductive path is formed between the pressure-sensitive adhesive layer and the base film, it becomes possible to perform a continuity test even in a condition where the pressure-sensitive adhesive sheet for dicing is applied onto the semiconductor wafer. Because a conventional testing step has been performed by directly placing the semiconductor wafer onto the testing stage, flaws and scratches have been generated on the backside of the semiconductor wafer and damage (cracks) has been generated on the semiconductor wafer due to foreign substances, particles, and the like that are present on the stage. However, with the above-described method, because the semiconductor wafer is placed on the testing stage in a condition where the semiconductor wafer is fixed onto the pressure-sensitive adhesive sheet for dicing (including a temporary fixing), the pressure-sensitive adhesive sheet for dicing can also function as a protective sheet. As a result, flaws, scratches, and damages are prevented from being generated on the backside of the semiconductor wafer.

Further, in order to solve the above-described problems, a method of manufacturing a semiconductor device according to the present invention includes the steps of applying a dicing ring and a semiconductor wafer onto the pressure-sensitive adhesive layer in the pressure-sensitive adhesive sheet according to any one of claims 1 to 9 with a surface opposite a circuit forming surface as an application surface, forming semiconductor chips in a condition where at least a portion of the base film is left by dicing the semiconductor wafer from the circuit forming surface side, performing a continuity test on the semiconductor chips through establishment of an electrical connection by placing the pressure-sensitive adhesive sheet onto a conductive testing stage in a condition where each semiconductor chip right after dicing is fixed and by contacting one connection terminal to the circuit forming surface of the semiconductor chip and contacting another connection terminal to the pressure-sensitive adhesive layer, the dicing ring, or the continuity testing stage, and picking up the semiconductor chips from the pressure-sensitive adhesive sheet.

In the pressure-sensitive adhesive sheet that is suitable as the above-described pressure-sensitive adhesive sheet for dicing, because the electrically conductive path is formed between the pressure-sensitive adhesive layer and the base film, it becomes possible to perform a continuity test on each semiconductor chip by generating an electrical connection by contacting one connection terminal to the circuit forming surface of the semiconductor chip right after dicing and contacting the other connection terminal to the pressure-sensitive adhesive layer, the dicing ring, or the continuity testing stage. As a result, the testing step on the semiconductor wafer before dicing becomes unnecessary, and problems of deformation (warping) and damage of the semiconductor wafer can be avoided.

Further, because a conventional testing step has been performed by directly placing the semiconductor wafer on the testing stage, flaws and scratches have been generated on the backside of the semiconductor wafer and damage (cracks) has been generated on the semiconductor wafer due to foreign substances, particles, and the like that are present on the stage. However, with the above-described method, because each semiconductor chip is placed on the testing stage in a condition where the semiconductor chip is fixed to the pressure-sensitive adhesive sheet for dicing (including a temporary fixing), the pressure-sensitive adhesive sheet for dicing can also function as a protective sheet. As a result, the semiconductor chip can be manufactured without flaws and scratches on the backside.

In order to solve the above-described problems, a method of manufacturing a semiconductor device according to the present invention includes the steps of applying a semiconductor wafer onto the pressure-sensitive adhesive layer in the pressure-sensitive adhesive sheet according to any one of claims 10 to 16 with a surface opposite a circuit forming surface as an application surface, performing a continuity test on the semiconductor wafer through establishment of an electrical connection by placing the pressure-sensitive adhesive sheet onto a conductive testing stage in a condition where the semiconductor wafer is fixed and by contacting one connection terminal to the circuit forming surface of the semiconductor wafer and contacting another connection terminal to the pressure-sensitive adhesive layer, forming a semiconductor chip in a condition where at least a portion of the base film is left by dicing the semiconductor wafer from the circuit forming surface side, and picking up the semiconductor chip from the pressure-sensitive adhesive sheet.

In the pressure-sensitive adhesive sheet that is suitable as the above-described pressure-sensitive adhesive sheet for testing, because the electrically conductive path is formed between the pressure-sensitive adhesive layer and the base film, a continuity test becomes possible even in a condition where the pressure-sensitive adhesive sheet for testing is applied onto the semiconductor wafer. Because a conventional testing step has been performed by directly placing the semiconductor wafer on the testing stage, flaws and scratches have been generated on the backside of the semiconductor wafer and damage (cracks) has been generated on the semiconductor wafer due to foreign substances, particles, and the like that are present on the stage. However, with the above-described method, because the semiconductor wafer is placed on the testing stage in a condition where the semiconductor wafer is fixed onto the pressure-sensitive adhesive sheet for testing (including a temporary fixing), the pressure-sensitive adhesive sheet for testing can also function as a protective sheet. As a result, flaws, scratches, and damage are prevented from being generated on the backside of the semiconductor wafer.

Further, in order to solve the above-described problems, a method of manufacturing a semiconductor device according to the present invention includes the steps of applying a semiconductor wafer onto the pressure-sensitive adhesive layer in the pressure-sensitive adhesive sheet according to any one of claims 10 to 16 with a surface opposite a circuit forming surface as an application surface, forming semiconductor chips in a condition where at least a portion of the base film is left by dicing the semiconductor wafer from the circuit forming surface side, performing a continuity test on the semiconductor chips through establishment of an electrical connection by placing the pressure-sensitive adhesive sheet onto a conductive testing stage in a condition where each semiconductor chip right after dicing is fixed and by contacting one connection terminal to the circuit forming surface of the semiconductor chip and contacting another connection terminal to the pressure-sensitive adhesive layer, and picking up the semiconductor chips from the pressure-sensitive adhesive sheet.

In the pressure-sensitive adhesive sheet that is suitable as the above-described pressure-sensitive adhesive sheet for testing, because the electrically conductive path is formed between the pressure-sensitive adhesive layer and the base film, it becomes possible to perform a continuity test on each semiconductor chip by generating an electrical connection by contacting one connection terminal to the circuit forming surface of the semiconductor chip right after dicing and contacting the other connection terminal to the pressure-sensitive adhesive layer. As a result, a testing step on the semiconductor wafer before dicing becomes unnecessary, and problems of deformation (warping) and damages of the semiconductor wafer can be avoided.

Further, because a conventional testing step has been performed by directly placing the semiconductor wafer on the testing stage, flaws and scratches have been generated on the backside of the semiconductor wafer and damage (cracks) has been generated on the semiconductor wafer due to foreign substances, particles, and the like that are present on the stage. However, with the above-described method, because each semiconductor chip is placed on the testing stage in a condition where the semiconductor chip is fixed to the pressure-sensitive adhesive sheet for testing (including a temporary fixing), the pressure-sensitive adhesive sheet for testing can also function as a protective sheet. As a result, the semiconductor chip can be manufactured without flaws and scratches on the backside.

Effect of the Invention

The present invention has advantages as described below with the means described above.

That is, because the pressure-sensitive adhesive sheet of the present invention has a configuration in which a conductive path is provided between the pressure-sensitive adhesive layer and the base film, a continuity test can be performed in a condition where the semiconductor wafer or the semiconductor chip is fixed onto the pressure-sensitive adhesive sheet. As a result, the problems of deformation (warping) and damage of the semiconductor wafer that are conventionally generated in the continuity test can be avoided, and a semiconductor wafer or a semiconductor chip without flaws and scratches on the backside can be manufactured with an improved throughput.

Further, because the pressure-sensitive adhesive sheet of the present invention has excellent flexibility in the case where it is equipped with a support having a tensile modulus at 23° C. of 500 MPa or less, the sheet exhibits a good expanding property and pick-up property. As a result, the expanding step and the pick-up step can be performed in a condition where the semiconductor chip is applied onto the pressure-sensitive adhesive sheet.

BRIEF DESCRIPTION OF THE DRAWINGS

FIG. 1 is a cross-sectional schematic diagram schematically showing a pressure-sensitive adhesive sheet for dicing according to one embodiment of the present invention.

FIG. 2 is a graph showing the relationship between the gap area ratio and the light transmittance of a base film of the pressure-sensitive adhesive sheet for dicing.

FIG. 3 is schematic diagrams for describing a method of manufacturing a semiconductor device using the pressure-sensitive adhesive sheet for dicing. FIG. 3(a) shows a testing step of a semiconductor wafer, and FIG. 3(b) shows a testing step of a semiconductor chip.

FIG. 4 is a cross-sectional schematic diagram schematically showing a pressure-sensitive adhesive sheet for dicing according to one embodiment of the present invention.

FIG. 5 is cross-sectional schematic diagrams schematically showing a pressure-sensitive adhesive sheet for testing according to one embodiment of the present invention. FIG. 5(a) shows a case in which conductive particles are contained in a pressure-sensitive adhesive layer, and FIG. 5(b) shows a case in which a portion of conductive fibers is exposed from the surface of the pressure-sensitive adhesive layer.

FIG. 6 is a plan view schematically showing the pressure-sensitive adhesive sheet for testing.

FIG. 7 is schematic diagrams for describing a method of manufacturing a semiconductor device using the pressure-sensitive adhesive sheet for testing. FIG. 7(a) shows a testing step of the semiconductor wafer, and FIG. 7(b) shows a testing step of the semiconductor chip.

FIG. 8 is photographs showing the surface condition of the pressure-sensitive adhesive layer in the pressure-sensitive adhesive sheet for dicing according to Example 1 of the present invention. FIG. 8(a) shows a photograph taken by an optical microscope, and FIG. 8(b) shows a photograph taken by a scanning electron microscope.

DESCRIPTION OF THE REFERENCE NUMERALS

| | |
|---|---|
| 1 | BASE FILM |
| 3 | PRESSURE-SENSITIVE ADHESIVE LAYER |
| 5 | CONDUCTIVE FIBERS |
| 7 | SEPARATOR |
| 9 | SEMICONDUCTOR WAFER |
| 10 | PRESSURE-SENSITIVE ADHESIVE SHEET FOR DICING |
| 11 | SEMICONDUCTOR CHIP |
| 13 | CONTINUITY TESTING STAGE |
| 15 | CIRCUIT FORMING SURFACE |
| 17 | DICING RING |
| 20 | PRESSURE-SENSITIVE ADHESIVE SHEET FOR DICING |
| 23 | PRESSURE-SENSITIVE ADHESIVE LAYER |
| 25 | CONDUCTIVE PARTICLES |
| 30 | PRESSURE-SENSITIVE ADHESIVE SHEET FOR TESTING |
| 31 | SUPPORT |
| 33 | PRESSURE-SENSITIVE ADHESIVE LAYER |

BEST MODE FOR CARRYING OUT THE INVENTION

First Embodiment

An embodiment of the present invention is described below with reference to FIG. 1. FIG. 1 is cross-sectional schematic diagrams schematically showing a pressure-sensitive adhesive sheet for testing (hereinafter referred to as a "pressure-sensitive adhesive sheet") according to the present embodiment. However, parts that are not necessary for the description are not shown, and there are parts represented in, e.g., an enlarged or reduced manner to simplify the description.

As shown in FIG. 1, a pressure-sensitive adhesive sheet 10 according to the present invention has a configuration in which a pressure-sensitive adhesive layer 3 is provided on a base film 1.

The base film 1 is a supporting base material containing conductive fibers 5 woven in a known manner. Because the film is woven with the conductive fibers 5, a conductive path can be formed in a thickness direction and any direction within the surface. Therefore, because various detoured conductive paths are formed, conductivity is ensured at all times even when a portion of the base film 1 is cut by dicing.

The weaving pattern of the conductive fibers 5 is not particularly limited, and a known weaving pattern is used. For example, a mesh type, a woven fabric type, and non-woven fabric type can be used. Among these, the mesh type is preferred from the viewpoint of the aperture of the base film 1. The aperture (%) means the opening area of the fiber base material and can be calculated by the following equation.

opening=25400/(number of fibers(inch))−(diameter of fibers($D$))  [Equation 1]

aperture (%)=(opening)$^2$/(opening+(diameter of fibers ($D$)))$^2$×100

The aperture is preferably in a range of 10 to 90%, and more preferably in a range of 20 to 70%. When the aperture is less than 10%, the transmittance of radiation irradiated from the base film 1 side excessively decreases in the case where the pressure-sensitive adhesive layer 3 is a radiation curing type described later. As a result, there is a case in which curing of the pressure-sensitive adhesive is insufficient. On the other hand, when the aperture exceeds 90%, the anchoring property of the pressure-sensitive adhesive layer 3 to the base film 1 decreases, and a pressure-sensitive adhesive residue easily occurs on the semiconductor chip. Moreover, the relationship between the gap area ratio and the light transmittance of the base film 1 is shown in FIG. 2. The gap area ratio means a ratio of opening portions occupying the surface area of the base film 1, and it is shown that the gap area ratio has a proportional relationship with the light transmittance.

Examples of the conductive fibers 5 are fibers in which a conductive layer of a metal such as copper, nickel, aluminum, gold, and silver, or of carbon is formed on the surface of a plastic fiber such as polyester, nylon, and acrylic fiber. Further, metal fibers formed of a metal such as copper, nickel, and aluminum may be also used. Among these conductive fibers, conductive fibers in which a conductive layer is formed on a plastic fiber are preferred when considering lightness, flexibility, workability (cutting, punching), abrasion of a blade during the dicing step, and the like.

The thickness of the base film 1 is not particularly limited; it is normally 10 to 300 μm, preferably 30 to 200 μm, and especially preferably 50 to 150 μm. Moreover, the base film 1 is a base material formed of a single layer in which the conductive fibers 5 are woven in a predetermined weaving pattern. Because of that, the thickness of the base film 1 can be adjusted by variously changing the diameter of the conductive fibers 5.

The conductivity of the base film 1 is not particularly limited as long as it is in a range of which the continuity test is possible. Specifically, the range of which the continuity test is possible is that the surface resistivity is 1 Ω/☐ or less, preferably 5×10$^{-1}$Ω/☐ or less, and especially preferably 1×10$^{-1}$ Ω/☐ or less. When the surface resistivity exceeds 1 Ω/☐, the conductivity in a direction within the surface decreases, and there is a case in which the continuity test becomes difficult to perform. Moreover, the lower limit is preferably 1×10$^{-4}$ Ω/☐ or more from a practical viewpoint. Further, the volume resistivity is 1×10$^{-1}$ Ω·cm or less, preferably 1×10$^{-2}$ Ω·cm or less, and especially preferably 1×10$^{-3}$ Ω·cm or less. When the volume resistivity exceeds 1×10$^{-1}$ Ω·cm, conduction to the continuity testing stage through the base film 1 becomes difficult, and there is a case in which the continuity test cannot be carried out properly. Moreover, the lower limit is preferably 1×10$^{-7}$ Ω·cm or more from a practical viewpoint. The conductivity evaluation is made according to JIS K7194 using Lorester MP MCP-T 350 manufactured by Mitsubishi Chemical Corporation, and the conductivity can be obtained by measuring the surface of the base film 1. At this time, calculation of the surface resistivity and the volume resistivity is performed based on a resistivity correction factor RCF of 4.532. Further, the volume resistivity is calculated using the thickness of the base film 1.

A portion of the conductive fibers 5 constituting the base film 1 is exposed on the surface of the pressure-sensitive adhesive layer 3. Because of this, the conductive path between the semiconductor wafer and the like and the base film 1 is secured without imparting conductivity, e.g., by making the pressure-sensitive adhesive layer 3 contain conductive particles. As a result, the continuity test becomes possible without impairing the dicing function. The base film 1 is configured by weaving the conductive fibers 5 in a predetermined weaving pattern, and the intersecting portions of the conductive fibers 5 form projections. A portion of the conductive fibers 5 being exposed from the surface of the pressure-sensitive adhesive layer 3 means that these intersecting portions are exposed from the surface without being covered by the pressure-sensitive adhesive layer 3.

The tensile modulus of the pressure-sensitive adhesive layer 3 before being formed on the base film is preferably 0.2 MPa or less, more preferably 0.01 to 0.15 MPa, and especially preferably 0.03 to 0.1 MPa. By setting the tensile modulus to 0.2 MPa or less, the pressure-sensitive adhesive layer 3 is easily buried into the base film 1 when transferring the pressure-sensitive adhesive layer 3 onto the base film 1 and pressures is applied to it, and it becomes possible to expose a portion of the conductive fibers 5 from the surface of the pressure-sensitive adhesive layer 3. Moreover, the tensile modulus is a value measured according to JIS K7127. Moreover, the value of the tensile modulus can be adjusted by appropriately changing the added amount of a crosslinking agent described later.

A known pressure-sensitive adhesive including a (meth) acrylic polymer, a rubber polymer, or the like may be used as a forming material of the pressure-sensitive adhesive layer 3. Among these, an acrylic pressure-sensitive adhesive having an acrylic polymer as a base polymer is preferred from the viewpoint of contamination of the semiconductor wafer and the like.

Examples of the monomer component forming the (meth) acrylic polymer are alkyl(meth)acrylates having a linear or a branched alkyl group having 30 or less carbon number, preferably 4 to 18 carbon number, such as a methyl group, an ethyl group, an n-propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group. These alkyl(meth)acrylates may be used alone, or two or more of them may be used.

Examples of the monomer component other than the above include a carboxyl group-containing monomer such as acrylic acid, methacrylic acid, carboxyethyl(meth)acrylate, carboxypentyl(meth)acrylate, itaconic acid, maleic acid, fumaric acid, and crotonic acid, an acid anhydride monomer such as maleic anhydride and itaconic anhydride, a hydroxyl group-containing monomer such as 2-hydroxyethyl(meth) acrylate, 2-hydroxypropyl(meth)acrylate, 4-hydroxybutyl (meth)acrylate, 6-hydroxyhexyl(meth)acrylate, 8-hydroxyethyl(meth)acrylate, 10-hydroxydecyl(meth)acrylate, 12-hydroxylauryl(meth)acrylate, and (4-hydroxymethylcyclohexyl)methyl(meth)acrylate, a sulfonic acid group-containing monomer such as styrenesulfonic acid, allylsulfonic acid, 2-(meth)acrylamide-2-methylpropanesulfonic acid, (meth)acrylamidepropanesulfonic acid, sulfopropyl(meth)acrylate, and (meth)acryloyloxynaphthalenesulfonic acid, and a phosphate group-containing monomer such as 2-hydroxyethylacryloylphosphate. These monomer components may be used alone, or two or more of them may be used.

Further, a multifunctional monomer and the like may be used as a copolymerization monomer component as needed for the purpose of a crosslinking treatment or the like of the (meth)acrylic polymer.

Examples of the multifunctional monomer include hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, epoxy(meth)acrylate, polyester(meth)acrylate, and urethane(meth)acrylate. These multifunctional monomers may be used alone, or two or more of them may be used.

The amount used of the multifunctional monomer is preferably 30% by weight or less of all the monomer components from the viewpoint of, e.g., adhesive characteristics, and more preferably 15% by weight or less.

Preparation of the (meth)acrylic polymer can be performed by adopting an appropriate method such as a solution polymerization method, an emulsion polymerization method., a bulk polymerization method, or a suspension polymerization method on a mixture containing one type or two types or more of the monomer components.

Exemplary polymerization initiators include a peroxide based initiator such as hydrogen peroxide, benzoyl peroxide, and t-butyl peroxide. The polymerization initiator is preferably used alone, but it can be used as a redox system polymerization initiator in combination with a reducing agent. Exemplary reducing agents include an ionized salt such as sulfite, bisulfite, iron salt, copper salt, and cobalt salt, amines such as triethanolamine, and a reducing sugar such as aldose and ketose. Further, an azo compound is also a preferred polymerization initiator, and 2,2'-azobis-2-methylpropioamidinate, 2,2'-azobis-2,4-dimethylvaleronitrile, 2,2'-azobis-N,N'-dimethyleneisobutylamidinate, 2,2'-azobisisobutylonitrile, and 2,2'-azobis-2-methyl-N-(2-hydroxyethyl) propionamide, or the like may be used. Further, two types or more of the above-described polymerization initiator can be also used.

The reaction temperature is normally about 50 to 85° C., and the reaction time is about 1 to 8 hours. Further, among the above-mentioned manufacturing methods, the solution polymerization method is preferred, and a polar solvent such as ethyl acetate and toluene is generally used as a solvent of the (meth)acrylic polymer. The solution concentration is normally about 20 to 80% by weight.

A crosslinking agent may be appropriately added to the pressure-sensitive adhesive to increase the number average molecular weight of the (meth)acrylic polymer that is the base polymer. Exemplary crosslinking agents include a polyisocyanate compound, an epoxy compound, an aziridine compound, a melamine resin, a urea resin, an anhydride compound, polyamine, and a carboxyl group-containing polymer. In the case of using the crosslinking agent, the amount used thereof is preferably about 0.01 to 5 parts by weight with respect to the base polymer 100 parts by weight, considering that the adhesive strength for peeling off does not become too low. However, the amount of the crosslinking agent is preferably about 0.1 to 2 parts by weight, in order that the tensile modulus of the pressure-sensitive adhesive layer 3 may be 0.2 MPa or less. Moreover, the lower limit is preferably $1 \times 10^{-4}$ Ω/□ or more from a practical viewpoint. Further, traditional additives such as various conventionally known tackifier, antioxidant, filler, antioxidant, and coloring agents may be contained in the pressure-sensitive adhesive forming the pressure-sensitive adhesive layer 3 besides the above-described components as needed.

In order to improve the peeling property from the semiconductor chip, the pressure-sensitive adhesive is preferably a radiation curing type pressure-sensitive adhesive that is cured by radiation such as ultraviolet rays and electron beams. In the case of using a radiation curing type pressure-sensitive adhesive, because the adhesive strength of the pressure-sensitive adhesive layer 3 lowers due to radiation irradiation (for example, ultraviolet rays), the peeling of the pressure-sensitive adhesive sheet can be performed easily by radiating the radiation onto the pressure-sensitive adhesive layer 3. Moreover, in the case of using a radiation curing type pressure-sensitive adhesive as the pressure-sensitive adhesive, the above-described conductive fiber base material having an aperture of 10% or more is preferably used.

The radiation curing type pressure-sensitive adhesive having a radiation curable functional group such as a carbon-carbon double bond and that exhibits adherability can be used without particular limitation. Exemplary radiation curing type pressure-sensitive adhesives include a radiation curing type pressure-sensitive adhesive in which a radiation curable monomer component and oligomer component are included in the above-described (meth)acrylic polymer.

Exemplary compounding radiation curable monomer components and oligomer components include urethane (meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxy penta(meth)acrylate, dipentaerythiritol hexa(meth)acrylate, and 1,4-butylene glycol di(meth)acrylate. These may be used alone, or two or more types may be used.

The compounding amount of the radiation curable monomer component and oligomer component is not particularly limited. However, it is preferably about 5 to 500 parts by weight with respect to the base polymer 100 parts by weight of, e.g., the (meth)acrylic polymer constituting the pressure-sensitive adhesive considering adherability, and more preferably about 60 to 150 parts by weight.

Further, in the radiation curing type pressure-sensitive adhesive, a polymer having a carbon-carbon double bond in a polymer side-chain, in a main chain, or at the end of the main chain can be used as the base polymer. Such a base polymer preferably has a (meth)acrylic polymer as a basic skeleton. In this case, the radiation curable monomer component and oligomer component do not have to be added and they are optionally used.

A photopolymerization initiator is contained in the radiation curing type pressure-sensitive adhesive in the case of curing using ultraviolet rays, and the like. Exemplary photopolymerization initiators include an acetophenone compound such as 4-(2-hydroxyethoxy)phenyl(2-hydroxy-2-propyl)ketone, α-hydroxy-α,α-methylacetophenone, methoxyacetophenone, 2,2-dimethoxy-2-phenylacetophenone, 2,2-diethoxyacetophenone, 1-hydroxycyclohexylphenylketone, and 2-methyl-1-[4-(methylthio)phenyl]-2-morpholinopropane-1, a benzoin ether compound such as benzoin ethyl ether, benzoin isopropyl ether, and anizoin methyl ether, an α-ketol compound such as 2-methyl-2-hydroxypropylphenone, a ketal compound such as benzyldimethylketal, an aromatic sulfonyl chloride compound such as 2-naphthalenesulfonylchloride, a photoactive oxime compound such as 1-phenone-1,1-propanedion-2-(o-ethoxycarbonyl)oxime, a benzophenone compound such as benzophenone, benzoyl benzoic acid, and 3,3'-dimethyl-4-methoxybenzophenone, a thioxanthone compound such as thioxanthone, 2-chlorothioxanthone, 2-methylthioxanthone, 2,4-dimethylthioxanthone, isopropyl thioxanthene, 2,4-dichlorothioxanthone, 2,4-diethylthioxanthone, and 2,4-diisopropylthioxanthone, camphorquinone, ketone halide, acylphosphinoxide, and acylphosphonate.

The compounding amount of the photopolymerization initiator is preferably about 0.1 to 10 parts by weight with respect to the base polymer 100 parts by weight of, e,g., the (meth)acrylic polymer constituting the pressure-sensitive adhesive, and more preferably about 0.5 to 10 parts by weight.

Further, the thickness of the pressure-sensitive adhesive layer 3 before being transferred onto the base film 1 is 1 to 50 μm, preferably 3 to 20 μm, and especially preferably 5 to 20 μm. When the thickness is less than 1 μm, the adhesive strength decreases, the semiconductor chip is insufficiently held in dicing, and there is a case in which chip fly occurs. On the other hand, when the thickness exceeds 50 μm, it becomes difficult to expose a portion of the conductive fibers 5 constituting the base film from the surface of the pressure-sensitive adhesive layer 3, and there is a case in which it becomes difficult to secure the conductive path. Furthermore, vibration that occurs when dicing the semiconductor wafer becomes excessively large, and there is a case in which a crack (chipping) is generated in the semiconductor chip.

Conductive particles may be contained in the pressure-sensitive adhesive layer 3 for giving conductivity. In this manner, the electrically conductive path can be secured at least in the thickness direction. The conductivity of the pressure-sensitive adhesive layer 3 is obtained from, e.g., a structure in which the conductive particles are dispersed in a mutually contacting condition. However, conductivity can be exhibited by the tunneling effect even in a dispersed condition where the conductive particles are close to each other to a certain degree.

The condition in which the conductive particles are contacting one another in at least the film thickness direction provides conductivity in that direction. As a result, the conductive path with the base film can be secured further reliably even when the pressure-sensitive adhesive layer 3 is completely cut and separated by dicing. Moreover, in the case of providing conductive anisotropy that exhibits conductivity only in the film thickness direction, the conductive particles may be dispersed in a mutually contacting condition only in the thickness direction by dispersing the conductive particles in the pressure-sensitive adhesive layer 3 in a condition where the conductive particles are separated from one another and then compressing the film in the film thickness direction to a predetermined film thickness.

The content of the conductive particles is 1 to 500 parts by weight to the base polymer 100 parts by weight constituting the pressure-sensitive adhesive layer 3, preferably 5 to 500 parts by weight, and especially preferably 10 to 200 parts by weight. When it is in this value range, conductivity can be given to the pressure-sensitive adhesive layer 3, the rate of the conductive particles occupying the pressure-sensitive adhesive layer 3 is prevented from becoming too high, and adherability of the pressure-sensitive adhesive layer 3 can be ensured to a degree where chip fly and the like do not occur during dicing.

The type of the conductive particles used in the present invention is not particularly limited, and examples include metal particles such as nickel, gold, silver, copper, aluminum, solder, and platinum, metal oxide particles such as ITO (indium-tin oxide), ATI, titanium oxide, tin oxide, copper oxide, and nickel oxide, carbon particles such as diamond, carbon black, carbon tube, and carbon fiber, and a composite conductive particles in which the surface of a plastic particle such as polystyrene is covered with a conductive layer. Further, the shape of these conductive particles is not particularly limited, and examples include a sphere shape, a needle shape, a fiber shape, a flake shape, a spike shape, and a coil shape.

Furthermore, the size of the conductive particles is not particularly limited, and for example, the particle diameter is 100 μm or less, preferably 1 nm to 100 μm, and especially preferably 10 nm to 50 μm. In the case where the particle diameter exceeds 100 μm, variation in film thickness and surface unevenness of the pressure-sensitive adhesive layer 3 becomes large, and there may be a case in which the dicing property lowers. The particle diameter is a value measured according to a BET method.

Further, in the pressure-sensitive adhesive sheet 10, a separator is preferably provided on the pressure-sensitive adhesive layer 3. By providing the separator, heat treatment can be performed on the laminated sheet (the pressure-sensitive adhesive sheet) and the sheet can be stored by forming it into a roll shape. Further, the surface of the pressure-sensitive adhesive layer 3 can be protected from dust, and the like until the pressure-sensitive adhesive sheet 10 is used.

Exemplary constituting materials of the separator include polyether ether ketone, polyetherimide, polyarylate, polyethylene naphthalate, and a plastic film such as a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, an ethylene-vinylacetate copolymer film, an ionomer resin film, an ethylene(meth)acrylate copolymer film, and ethylene-(meth)acrylate ester copolymer film, a polystyrene film, and a polycarbonate film.

A peeling treatment such as a silicone treatment, a long-chain alkyl treatment, and a fluorine treatment may be carried out on one side of the separator to improve the peeling property from the pressure-sensitive adhesive layer 3 as needed. Further, an ultraviolet ray anti-transmission treatment or the like may be also carried out as needed so that the pressure-sensitive adhesive sheet 10 does not react with the environmental ultraviolet ray. The thickness of the separator is normally 5 to 200 μm, preferably 25 to 100 μm, and further preferably 38 to 60 μm.

A surface that is satin-finished or having an uneven structure can be used as the surface that does not contact the pressure-sensitive adhesive layer 3 of the separator.

The pressure-sensitive adhesive sheet 10 can be manufactured by forming the pressure-sensitive adhesive layer 3 on a separator and then applying these onto the base film 1 for example. At this time, the pressure-sensitive adhesive layer 3 is preferably pressed with a predetermined pressing force so that a portion of the conductive fibers constituting the base film 1 is exposed from the surface of the pressure-sensitive adhesive layer 3. The pressing force is, for example, 0.01 to 1 MPa, preferably 0.05 to 0.5 MPa, and more preferably 0.08 to 0.3 MPa. The application temperature is preferably, for example, 20 to 100° C. Further, it is also possible to manufacture the sheet by separately forming the pressure-sensitive adhesive layer 3 by directly applying a pressure-sensitive adhesive solution onto the surface of the base film 1 and drying it (by heat-crosslinking as needed) and by applying the separator onto the surface of this pressure-sensitive adhesive layer 3 as needed. In this case, the pressure-sensitive adhesive solution preferably has fluidity at a level where a portion of the conductive fibers will be exposed after application of the solution. One or two or more layers of the pressure-sensitive adhesive layer 3 may be laminated, in as much as the configuration of the present invention is not impaired.

The laminated sheet in which the separator is provided on the pressure-sensitive adhesive layer 3 is made into a roll and is preferably subjected to heat treatment. The characteristics of the pressure-sensitive adhesive can be stabilized by heat treatment on the laminated sheet. The temperature in the heat treatment is about 30 to 60° C., and the treatment time is about 12 to 100 hours.

The pressure-sensitive adhesive sheet 10 may have an appropriate shape such as a sheet-like shape and a roll-like shape depending on use. For wafer dicing use, for example, a sheet that is cut and processed into a required shape in advance is preferably used. Further, the outer diameter of the pressure-sensitive adhesive sheet 10 may be larger than the outer diameter of the semiconductor wafer and may be smaller than the inner diameter of the dicing ring.

Further, the adhesive strength of the pressure-sensitive adhesive layer 3 is preferably 20 N/20 mm or less based on the adhesive strength (90 degree peel value, peeling speed 300 mm/min.) relative to a silicon wafer at a normal temperature, more preferably 0.001 to 10 N/20 mm, and especially preferably 0.01 to 8 N/20 mm. The reasons why the adhesive strength of the pressure-sensitive adhesive layer 3 is defined by using a silicon mirror wafer are that the roughness condition of the surface of the silicon mirror wafer is smooth to a certain degree and that the silicon mirror wafer is constituted of a homogeneous material as the semiconductor wafer and the like serving as a workpiece to be diced and picked up. Further, the reason why the adhesive strength at the measurement temperature 23±3° C. is set to a standard is that picking up is performed normally at a room temperature (23° C.).

The pressure-sensitive adhesive layer 3 preferably has a peeling property such that the increased amount $\Delta C$ of organic contaminants on the surface becomes 5% or less on the application surface of the semiconductor wafer made of silicon. With the pressure-sensitive adhesive layer 3 having such a peeling property, generation of an adhesive residue on the semiconductor chip after picking up can be reduced. The value of the increased amount $\Delta C$ (%) of organic contaminants on the surface is the value obtained by subtracting the value $C2$ (%) of the amount of organic contaminants on the surface of the semiconductor wafer from the value $C1$ (%) of the amount of organic contaminants on the surface of the semiconductor wafer when the pressure-sensitive adhesive sheet 10 is peeled at 23° C. after dicing and right before picking up the semiconductor wafer. Further, in the case where the pressure-sensitive adhesive layer 3 contains the radiation curing type pressure-sensitive adhesive, the increased amount $\Delta C$ of organic contaminants on the surface shows a value when the sheet is peeled after irradiation of radiation.

In the pressure-sensitive adhesive sheet 10 according to the present invention, the adhesive strength for peeling off during picking up is controlled to be low or is set to be able to be controlled as described above. However, when the adhesive strength is low, a chip that is cut and separated cannot be held when performing dicing that is a pre-step, and there is a high possibility of the chip being peeled off from the pressure-sensitive adhesive sheet 10 during dicing (chip fly occurs). Because of that, a pressure-sensitive adhesive sheet is preferably used which is, by forming the pressure-sensitive adhesive layer 3 from a radiation curing type pressure-sensitive adhesive that is capable of reducing the adhesive strength through radiation irradiation, capable of reducing the adhesive strength by radiation irradiation after the dicing step while maintaining the adhesive strength at a certain level during dicing. Further, from the same viewpoint, it is also suitable that the pressure-sensitive adhesive layer be formed from a heat foaming-peeling type pressure-sensitive adhesive that is capable of reducing the adhesive strength by heating. In such a case, the adhesive strength is reduced by applying a known operation such as heating after dicing, and then picking up can be performed.

Next, a method of manufacturing a semiconductor device according to the present invention is described. The semiconductor device manufacturing method of the present invention includes a mounting step of applying the semiconductor wafer onto the pressure-sensitive adhesive layer 3 of the pressure-sensitive adhesive sheet 10, a testing step for the semiconductor wafer or the semiconductor chip, a dicing step of dicing the semiconductor wafer, and a picking up step of picking up the semiconductor chip. With the pressure-sensitive adhesive sheet 10 according to the present invention, a continuity testing step can be performed even in a condition where the semiconductor wafer is applied as described above. Therefore, the continuity testing step may be performed on the semiconductor wafer before the dicing step, or the continuity testing step may be performed on each semiconductor chip after the dicing step. Moreover, the manufacturing method of the present invention can be suitably adopted in the case where the thickness of the semiconductor wafer is less than 100 μm, and further less than 50 μm.

The above-described mounting step is performed by superposing the semiconductor wafer and the pressure-sensitive adhesive sheet so that the backside of the semiconductor wafer (the surface opposite the circuit forming surface) and the pressure-sensitive adhesive layer 3 side become the application surfaces and by pressing them with pressing means such as a pressing roll. Further, the semiconductor wafer and the pressure-sensitive adhesive sheet 10 may be applied by superposing them as described above in a container that is capable of being pressurized (such as an autoclave) and pressurizing the inside of the container. At this time, application may be performed through pressing with the pressing means. Further, application may be performed in the same manner as described above in a vacuum chamber. The application temperature for application is not limited at all. However, it is preferably 20 to 80° C.

In the case of performing the continuity test on a semiconductor wafer 9 before the dicing step, this semiconductor wafer 9 is placed on a continuity testing stage 13 in a condition where the pressure-sensitive adhesive sheet 10 is applied (see FIG. 3(a)). Next, a conductive path is secured by contacting one of the terminals for the continuity test to a circuit forming surface (electrode) 15 of the semiconductor wafer 9 and by contacting another terminal to the pressure-sensitive adhesive layer 3 or the continuity testing stage 13. After that, a predetermined voltage is applied between the terminals, and the conduction of the circuit formed in the semiconductor wafer 9 is confirmed based on the resistance value.

The above-described dicing step is a step of forming semiconductor chips by cutting (dicing) the semiconductor wafer 9. The dicing is performed according to a normal method from the circuit surface side of the semiconductor wafer, and a known method may be used such as blade dicing, laser dicing, plasma dicing, and breaking. Further, a cutting method called full-cut method that cuts into to the pressure-sensitive adhesive sheet 10 may be adopted as the cutting method. In the present invention, because the conductive path is secured between the base film 1 and the pressure-sensitive adhesive layer 3 of the pressure-sensitive adhesive sheet 10, the continuity testing step for a semiconductor chip that is described later can be performed even in the case where the pressure-sensitive adhesive layer 3 is completely cut and a portion of the base film 1 is cut. The dicing apparatus used in the present step is not particularly limited, and a conventional known apparatus may be used.

In the case of performing the continuity test on the semiconductor chip 11 after the dicing step, each semiconductor chip 11 is placed on the continuity testing stage 13 in a condition where each semiconductor chip 11 is applied onto the pressure-sensitive adhesive sheet 10 (see FIG. 3(b)). Next, a conductive path is secured by contacting one of the terminals for the continuity test to a circuit forming surface (electrode) 15 of each semiconductor chip 11 and by contacting another terminal to the pressure-sensitive adhesive layer 3, the dicing ring 17, or the continuity testing stage 13. However, because the conductive particles are contained in the pressure-sensitive adhesive layer 3, conductivity can be exhibited in any direction within the surface, and the thickness direction, the other terminal is contacted to the pressure-sensitive adhesive layer 3. After that, a predetermined voltage is applied between the terminals, and the conduction of each semiconductor chip 11 is confirmed based on the resistance value. Moreover, in the case where the pressure-sensitive adhesive layer 3 is completely cut in the dicing step, the other terminal is contacted to the continuity testing stage 13. Because the pressure-sensitive adhesive sheet 10 has a structure in which the conductive path is secured between the base film 1 and the pressure-sensitive adhesive layer 3, the continuity test becomes possible even when the pressure-sensitive adhesive layer 3 is completely cut and a portion of the base film 1 is cut into. The dicing ring 17 preferably has conductivity.

The picking up step is performed for peeling the semiconductor chip 11 that is bonded and fixed to the pressure-sensitive adhesive sheet 10. The method of picking up is not particularly limited, and various conventionally known methods may be adopted. Exemplary methods include a method of thrusting an individual semiconductor chip 11 from the side of the pressure-sensitive adhesive sheet 10 using a needle and picking up the thrust semiconductor chip 11 by a pick-up apparatus.

In the case of using the pressure-sensitive adhesive sheet 10 having a radiation curing type pressure-sensitive adhesive layer or a heat peeling type pressure-sensitive adhesive layer, radiation irradiation or a heat treatment may be carried out on the pressure-sensitive adhesive layer 3. In this manner, the adherability is reduced to facilitate picking up. In the case of a pressure-sensitive adhesive layer 3 of a radiation curing type, conditions such as radiation intensity and a radiation time during radiation irradiation are not particularly limited and may be appropriately set as needed. Further, in the case of a pressure-sensitive adhesive layer 3 of a heat peeling type, when heated, the pressure-sensitive adhesive layer 3 expands due to the heat foaming component or the heat expanding component and the bonding area with the semiconductor chip 11 can be remarkably decreased. In this manner, the adhesive strength of the pressure-sensitive adhesive sheet 10 to the semiconductor chip lowers, and the pressure-sensitive adhesive sheet 10 is easily peeled from the semiconductor chip 11. As a result, picking up becomes possible without damaging the semiconductor chip 11. The heating conditions such as the heating temperature and the heating time in the case of performing the heat treatment are not particularly limited and may be appropriately set as needed.

Second Embodiment

A second embodiment is described below with reference to FIG. 4. FIG. 4 is a cross-sectional schematic diagram schematically showing the pressure-sensitive adhesive sheet for dicing (hereinafter referred to as "a pressure-sensitive adhesive sheet") according to the second embodiment. Moreover, the description of each constituting member that is the same as that of the pressure-sensitive adhesive sheet for dicing or the like according to the above-described first embodiment is not given by assigning it with the same reference numeral.

As shown in FIG. 4, a pressure-sensitive adhesive sheet 20 according to the present invention has a configuration in which a pressure-sensitive adhesive layer 23 is provided on a base film 1.

The above-described pressure-sensitive adhesive layer 23 is not particularly limited as long as an electrically conductive path is secured at least in a thickness direction by inclusion of conductive particles. The conductivity of the pressure-sensitive adhesive layer 23 is obtained from a structure in which, for example, conductive particles are dispersed in a mutually contacting condition. However, conductivity can be exhibited by the tunneling effect even in a dispersed condition where the conductive particles are close to one another to a certain degree.

The condition in which the conductive particles 25 are contacting one another in at least the film thickness direction provides conductivity in that direction. As a result, the conductive path with the base film 1 can be secured even when the pressure-sensitive adhesive layer 23 is completely cut and separated by dicing. Moreover, in the case of providing conductive anisotropy that exhibits conductivity, e.g., only in the film thickness direction, the conductive particles 25 may be dispersed in a mutually contacting condition other only in the thickness direction by dispersing the conductive particles 25 in the pressure-sensitive adhesive layer 23 in a condition where the conductive particles 25 are separated from one another and then compressing the film in the film thickness direction to a predetermined film thickness. In this case, the pressure-sensitive adhesive component constituting the pressure-sensitive adhesive layer 23 needs to have an insulating property.

The pressure-sensitive adhesive layer 23 may have conductivity in a range that a continuity test is possible. The conductivity of the pressure-sensitive adhesive sheet 20 that permits a continuity test is specifically such that the surface resistivity on its surface is 5 $\Omega/\square$ or less, preferably 1 $\Omega/\square$ or less, and especially preferably $5\times10^{-1}$ $\Omega/\square$ or less. Moreover, the lower limit is preferably $1\times10^{-3}$ $\Omega/\square$ or more from a practical viewpoint. Further, the volume resistivity of the pressure-sensitive adhesive layer 23 is $1\times10^{-1}$ $\Omega\cdot cm$ or less, preferably $1\times10^{-2}$ $\Omega\cdot cm$ or less, and especially preferably $1\times10^{-3}$ $\Omega\cdot cm$ or less. Moreover, the lower limit is preferably $1\times10^{-5}$ $\Omega\cdot cm$ or more from a practical viewpoint. The conductivity evaluation is performed according to JIS K7194 using Lorester MP MCP-T350 manufactured by Mitsubishi Chemical Corporation, and the conductivity can be obtained by measuring the surface of the pressure-sensitive adhesive of the pressure-sensitive adhesive sheet 20. At this time, calculation of the surface resistivity and the volume resistivity is performed based on a resistivity correction factor RCF of 4.532. Further, the volume resistivity is calculated by inputting the film thickness of the pressure-sensitive adhesive layer 23.

The content of the conductive particles 25 is 1 to 500 parts by weight with respect to the base polymer component 100 parts by weight constituting the pressure-sensitive adhesive layer 3, preferably 5 to 500 parts by weight, and especially preferably 10 to 200 parts by weight. When the content is less than 1 part by weight, mutual contact among the conductive particles 25 becomes difficult and the conductivity may be lowered. On the other hand, when the content exceeds 500 parts by weight, the ratio of the conductive particles occupying the pressure-sensitive adhesive layer 23 becomes too high, and the adherability may degrade.

The type of the conductive particles 25 used in the present invention is not particularly limited, and examples include metal particles such as nickel, gold, silver, copper, aluminum, solder, and platinum, metal oxide particles such as ITO (indium-tin oxide), ATI, titanium oxide, tin oxide, copper oxide, and nickel oxide, carbon particles such as diamond, carbon black, carbon tube, and carbon fiber, and a composite conductive particles in which the surface of a plastic particle such as polystyrene is covered with a conductive layer. Further, the shape of these conductive particles 25 is not particularly limited, and examples include a sphere shape, a needle shape, a fiber shape, a flake shape, a spike shape, and a coil shape.

Furthermore, the size of the conductive particles 25 is not particularly limited, and for example, the particle diameter is 100 μm or less, preferably 1 nm to 100 μm, and especially preferably 10 nm to 50 μm. In the case where the particle diameter exceeds 100 μm, variation in film thickness and surface unevenness of the pressure-sensitive adhesive layer 23 becomes large, and there may be a case in which the dicing property lowers. The particle diameter is a value measured according to a BET method.

The forming material of the pressure-sensitive adhesive layer 23 is the same as the pressure-sensitive adhesive layer 3 in the above-described pressure-sensitive adhesive sheet 10. Further, the thickness of the pressure-sensitive adhesive layer 23 is not particularly limited and is the same as the above-described pressure-sensitive adhesive layer 3.

Further, the pressure-sensitive adhesive sheet 20 is preferably provided with a separator 7 on the pressure-sensitive adhesive layer 23. The separator 7 is the same as the one described in the first embodiment.

The pressure-sensitive adhesive sheet 20 can be manufactured, e.g., by forming the pressure-sensitive adhesive layer 23 on the separator 7 and then applying these onto the base film 1. Further, the sheet can be also manufactured by separately forming the pressure-sensitive adhesive layer 23 by directly applying a pressure-sensitive adhesive solution onto the surface of the base film 1 and drying it (by heat-crosslinking as needed) and by applying the separator 7 onto the surface of this pressure-sensitive adhesive layer 23 as needed. One or two or more layers of the pressure-sensitive adhesive layer 23 may be laminated.

The laminated sheet in which the separator 7 is provided on the pressure-sensitive adhesive layer 23 is made into a roll and is preferably subjected to heating. The characteristics of the pressure-sensitive adhesive can be stabilized by heat treatment on the laminated sheet. The temperature for the heat treatment is about 30 to 60° C., and the treatment time is about 12 to 100 hours.

The pressure-sensitive adhesive sheet 20 may take an appropriate shape such as a sheet-like shape and a roll-like shape depending on its use. For wafer dicing use, for example, a sheet that is cut and processed in a required shape in advance is suitably used. Further, the outer diameter of the pressure-sensitive adhesive sheet 20 may be larger than the outer diameter of the semiconductor wafer and may be smaller than the inner diameter of the dicing ring.

Further, as in the case of the pressure-sensitive adhesive layer 3 according to the above-described first embodiment, the adhesive strength of the pressure-sensitive adhesive layer 23 is preferably 20 N/20 mm or less based on the adhesive strength to a silicon wafer at a normal temperature (90 degrees peel value, a peeling speed 300 mm/min.), more preferably 0.001 to 10 N/20 mm, and especially preferably 0.01 to 8 N/20 mm.

As in the case of the pressure-sensitive adhesive layer 3 according to the first embodiment, the pressure-sensitive adhesive layer 23 preferably has a peeling property such that an increased amount ΔC of organic contaminants on the surface where the semiconductor wafer made of silicon is bonded becomes 5% or less. With the pressure-sensitive adhesive layer 23 having such a peeling property, generation of an adhesive residue on the semiconductor chip after picking up can be reduced.

In the pressure-sensitive adhesive sheet 20 according to the second embodiment, the adhesive strength in peeling off during picking up is regulated to be low or is set to be controllable as described above. However, when the adhesive strength is low, a chip that is cut and separated cannot be held when performing dicing which is a pre-step, and there is a high possibility of the chip being peeled off from the pressure-sensitive adhesive sheet 20 during dicing (chip fly occurs). Because of that, preferably, a radiation curing-type pressure-sensitive adhesive agent that is capable of decreasing the adhesive strength by curing with radiation irradiation is used to form the pressure-sensitive adhesive layer 23, so that the adhesive strength can be reduced by radiation irradiation after the dicing step while maintaining a certain level of adhesive strength during dicing. Further, from the same viewpoint, the pressure-sensitive adhesive layer is preferably formed with a heat foaming-and-peeling type pressure-sensitive adhesive that is capable of decreasing the adhesive strength by heating. In such a case, the adhesive strength is decreased by applying a known operation such as heating after dicing, and then picking up can be performed.

A manufacturing method of a semiconductor device using the pressure-sensitive adhesive sheet 20 according to the second embodiment can be performed with the same method as described in the above-described first embodiment.

Third Embodiment

As shown in FIG. 5, a pressure-sensitive adhesive sheet for testing (hereinafter referred to as "a pressure-sensitive adhesive sheet") 30 according to a third embodiment has a configuration in which a base film 1 and a pressure-sensitive adhesive layer 33 are laminated one by one onto a support 31. Moreover, the description of each constituting member that is the same as that of the pressure-sensitive adhesive sheet for dicing or the like according to the above-described first and second embodiments is not given by assigning it with the same reference numeral.

The support 31 is a single plastic film (base material) or has a structure in which another pressure-sensitive adhesive layer is provided on the plastic film. In the case where the support 31 is made of a plastic film alone, another pressure-sensitive adhesive layer is preferably provided for joining with the base film 1.

A reason why the support 31 is adopted in the present invention is that the flexibility of the pressure-sensitive adhesive sheet 30 as a whole lowers, deformation required for the expanding step and the pick-up step does not occur, and the pick-up property lowers when there is only the base film 1 made of conductive fibers. From such a viewpoint, a support 31 is adopted in the present invention which has a tensile modulus at 23° C. of 500 MPa or less, preferably 400 MPa or less, and further preferably 350 MPa or less. Further, the support 31 is desirable to have a maximum point elongation (extension) of 100% or more, preferably 200% or more, and further preferably 250% or more. When the tensile modulus is 500 MPa or more and the maximum point elongation is 100% or more, the support 31 has sufficient flexibility and can show sufficient extensibility in expansion. Furthermore, even when it is thrust by a needle for picking up, localized deformation can be made possible. As a result, an excellent expanding property and pick-up property can be given to the pressure-sensitive adhesive sheet for testing itself. Moreover, the lower limit of the above-mentioned tensile modulus is preferably 10 MPa or more because a problem is generated in which work stability degrades by a lack of rigidity such that air bubbles and wrinkles are generated during application to the base film with the pressure-sensitive adhesive layer in between if the modulus of elasticity of the support is too small. Further, the above-mentioned maximum point elongation is preferably 2000% or less because a problem is generated in which the support is fully extended by the expanding step if the maximum point elongation is too large and the pick-up property contrarily lowers.

The above-described plastic film is not particularly limited, and typical exemplary materials are polyolefins such as low density polyethylene, linear polyethylene, medium density polyethylene, high density polyethylene, super low density polyethylene, random copolymer polypropylene, block copolymer polypropylene, homopolypropylene, polybutene, and polymethylpentene, polyesters such as an ethylene-vinylacetate copolymer, an ionomer resin, an ethylene-(meth)acrylate copolymer, an ethylene-(meth)acrylate ester (random, alternating) copolymer, an ethylene-butene copolymer, and ethylene-hexene copolymer, polyurethane, and polyethylene terephthalate, polyimide, polyether ketone, polystyrene, polyvinyl chloride, polyvinylidene chloride, a fluoro resin, a silicone resin, a cellulose based resin, and polymers of crosslinking bodies of these. Moreover, the above-described exemplified materials may be used by grafting functional groups, functional monomers, and modified monomers as needed.

Moreover, the plastic film may be either a single layer film or a multilayer film, and may be a blend film in which two kinds or more of the above-described resins are blended. The multilayer film can be manufactured with a traditional film laminating method such as a coextrusion method and a dry laminating method using the above-described resins. Further, the plastic film may be used unoriented, or a uniaxial or biaxial stretching treatment may be carried out as needed. A traditional physical or chemical treatment such as a matting treatment, a corona discharge treatment, a primer treatment, and a crosslinking treatment can be carried out on the surface of the plastic film thus manufactured, as needed.

The thickness (total thickness in the case where the plastic film is a multilayer film) of the support 31 is normally 10 to 300 μm and preferably about 30 to 200 μm.

The above-mentioned other pressure-sensitive adhesive layer is not particularly limited, and a pressure-sensitive adhesive layer made of a known or traditional pressure-sensitive adhesive may be used. Specific examples that may be used are various pressure-sensitive adhesives such as a rubber based, an acrylic, a silicone based, and a polyvinyl ether based adhesive. The thickness of the other pressure-sensitive adhesive layer is preferably 1 to 50 μm and more preferably 5 to 20 μm.

An example of the pressure-sensitive adhesive layer 33 is one in which electrical conduction is ensured at least in the thickness direction by inclusion of conductive particles as shown in FIG. 5(a). The conductivity of the pressure-sensitive adhesive layer 33 is obtained from a structure in which the conductive particles are dispersed, e.g., in a mutually contacting condition. However, conductivity can be exhibited by the tunneling effect even in a dispersed condition in which the conductive particles are close to one another to a certain degree.

The condition in which the conductive particles 25 are contacting one another in at least the film thickness direction provides conductivity in that direction. As a result, the electrically conductive path with the base film 1 can be secured even when the pressure-sensitive adhesive layer 33 is completely cut and separated by dicing. Moreover, in the case of providing conductive anisotropy that shows conductivity, for example, only in the film thickness direction, the conductive particles 25 may be dispersed in such a way as to contact one another only in the thickness direction by dispersing the conductive particles 25 in the pressure-sensitive adhesive layer 33 in a condition where the conductive particles 25 are separated from one another and then compressing the film to a predetermined film thickness. In this case, the pressure-sensitive adhesive component constituting the pressure-sensitive adhesive layer 33 needs to have an insulating property.

The pressure-sensitive adhesive layer 33 may have conductivity in a range that allows for a continuity test. The conductivity of the pressure-sensitive adhesive sheet 30 with which a continuity test is possible is specifically such that the surface resistivity is 5 Ω/□ or less on its surface, preferably 1 Ω/□ or less, and especially preferably $5\times10^{-1}$ Ω/□ or less. Moreover, the lower limit is preferably $1\times10^{-3}$ Ω/□ or more from a practical viewpoint. Further, the volume resistivity of the pressure-sensitive adhesive layer 33 is $1\times10^{-1}$ Ω·cm or less, preferably $1\times10^{-2}$ Ω·cm or less, and especially preferably $1\times10^{-3}$ Ω·cm or less. Moreover, the lower limit is preferably $1\times10^{-5}$ Ω·cm or more from a practical viewpoint. The conductivity evaluation is performed according to ITIS K7199 using Lorester MP MCP-T350 manufactured by Mitsubishi Chemical Corporation, and the conductivity can be obtained by measuring the surface of the pressure-sensitive adhesive of the pressure-sensitive adhesive sheet 30. At this time, calculation of the surface resistivity and the volume resistivity is performed based on a resistivity correction factor RCF of 4.532. Moreover, the volume resistivity is calculated using the total thickness of "the base film and the pressure-sensitive adhesive layer."

The content of the conductive particles 25 is 1 to 500 parts by weight with respect to the base polymer component 100 parts by weight constituting the pressure-sensitive adhesive layer 33, preferably 5 to 500 parts by weight, and especially preferably 10 to 200 parts by weight. When the content is less than 1 part by weight, mutual contact among the conductive particles 25 becomes difficult, and there is a case in which the conductivity lowers. On the other hand, when the content exceeds 500 parts by weight, the rate of the conductive particles occupying the pressure-sensitive adhesive layer 33 becomes too high, and there is a case in which the adherability of the pressure-sensitive adhesive layer 33 lowers.

Further, the pressure-sensitive adhesive sheet 30 according to the present embodiment may have a configuration in which a portion of the conductive fibers 5 constituting the base film 1 is exposed on the surface of the above-described pressure-sensitive adhesive layer 33. With such a configuration, a conductive path is secured between the semiconductor wafer and the like and the base film 1 without imparting conductivity, e.g., by making the pressure-sensitive adhesive layer 33 contain the conductive particles 25. As a result, the continuity test becomes possible without lowering the dicing function. The base film 1 is formed from the conductive fibers 5 woven in a predetermined weaving pattern, and the intersecting portions of the conductive fibers 5 form projections. A portion of the conductive fibers 5 being exposed from the surface of the pressure-sensitive adhesive layer 33 means that the intersecting portions are exposed from the surface without being covered by the pressure-sensitive adhesive layer 33.

The tensile modulus of the pressure-sensitive adhesive layer 33 before being formed on the base film 1 is preferably 0.2 MPa or less, more preferably 0.01 to 0.15 MPa, and especially preferably 0.03 to 0.1 MPa. By setting the tensile modulus to 0.2 MPa or less, the pressure-sensitive adhesive layer 33 becomes easily buried into the base film 1 when transferring the pressure-sensitive adhesive layer 33 onto the base film 1 and pressing it, and it becomes possible to expose a portion of the conductive fibers 5 from the surface of the pressure-sensitive adhesive layer 33. Moreover, the tensile modulus is a value measured according to JIS K7127. Moreover, the value of the tensile modulus can be adjusted by appropriately changing the added amount of a crosslinking agent described later.

The forming material of the pressure-sensitive adhesive layer 33 is the same as the pressure-sensitive adhesive layer 3 in the pressure-sensitive adhesive sheet 10. Further, the thickness of the pressure-sensitive adhesive layer 33 is not particularly limited and is the same as the above-described pressure-sensitive adhesive layer 3.

Further, the pressure-sensitive adhesive sheet 30 is preferably provided with a separator 7 on the pressure-sensitive adhesive layer 33. The separator 7 is the same as the one described in the first embodiment.

The pressure-sensitive adhesive sheet 30 can be manufactured, for example, by forming the pressure-sensitive adhesive layer 33 on the separator 7 and then applying these onto the base film 1. At this time, in the case of making a structure in which a portion of the conductive fibers constituting the base film 1 is exposed from the surface of the pressure-sensitive adhesive layer 33, the pressure-sensitive adhesive layer 33 is preferably pressed with a predetermined pressing force. In this case, the pressing force is 0.01 to 1 MPa, preferably 0.05 to 0.5 MPa, and more preferably 0.08 to 0.3 MPa. Further, the temperature during pressing is normally 20 to 100° C. Further, the sheet can be also manufactured by separately forming the pressure-sensitive adhesive layer 33 by directly applying a pressure-sensitive adhesive solution onto the surface of the base film 1 and drying it (by heat-crosslinking as needed) and by applying the separator 7 onto the surface of this pressure-sensitive adhesive layer 33 as needed. One or two or more layers of the pressure-sensitive adhesive layer 33 may be laminated.

The laminated sheet in which the separator 7 is provided on the pressure-sensitive adhesive layer 33 is made into a roll and is preferably subjected to heating. The characteristics of the pressure-sensitive adhesive can be stabilized by heat treatment on the laminated sheet. The temperature in the heat treatment is about 30 to 60° C., and the treatment time is about 12 to 100 hours.

The pressure-sensitive adhesive sheet 30 may take an appropriate shape such as a sheet-like shape and a roll-like shape depending on use. For wafer dicing use, for example, a sheet that is cut and processed into a necessary shape in advance is preferably used. Further, the outer diameter of the pressure-sensitive adhesive sheet 30 may be larger than the outer diameter of the semiconductor wafer and may be smaller than the inner diameter of the dicing ring.

Further, as in the case of the pressure-sensitive adhesive layer 3 according to the above-described first embodiment, the adhesive strength of the pressure-sensitive adhesive layer 33 is preferably 20 N/20 mm or less based on the adhesive strength to a silicon wafer at a normal temperature (90 degrees peel value, a peeling speed 300 mm/min.), more preferably 0.001 to 10 N/20 mm, and especially preferably 0.01 to 8 N/20 mm.

As in the case of the pressure-sensitive adhesive layer 3 according to the above-described first embodiment, the pressure-sensitive adhesive layer 33 preferably has a peeling property with which the increased amount $\Delta C$ of organic contaminants on the surface where the semiconductor wafer made of silicon is applied becomes 5% or less. With the pressure-sensitive adhesive layer 33 having such a peeling property, generation of an adhesive residue on the semiconductor chip after picking up can be decreased.

In the pressure-sensitive adhesive sheet 30 according to the third embodiment, the adhesive strength in peeling off during picking up is regulated to be low or is set to be controllable as described above. However, when the adhesive strength is low, a chip that is cut and separated cannot be held when performing dicing that is a pre-step, and there is a high possibility of the chip being peeled off from the pressure-sensitive adhesive sheet 30 during dicing (chip fly occurs). Because of that, a pressure-sensitive adhesive sheet is preferably used which can decrease the adhesive strength by forming the pressure-sensitive adhesive layer 33 from a radiation curing type pressure-sensitive adhesive that is capable of decreasing the adhesive strength through radiation curing and by radiation irradiation after the dicing step while maintaining the adhesive strength to a certain degree during dicing. Further, from the same viewpoint, the pressure-sensitive adhesive layer is preferably formed with a heat foaming-peeling type pressure-sensitive adhesive that is capable of decreasing the adhesive strength by heating. In such a case, the adhesive strength is reduced by applying a known operation such as heating after dicing, and then picking up can be performed.

Further, in the pressure-sensitive adhesive sheet 30 according to the third embodiment, the base film 1 and the pressure-sensitive adhesive layer 33 have a similar shape in plan view to that of the semiconductor wafer (see FIG. 6).

Next, a method of manufacturing a semiconductor device according to the third embodiment is described. The method of manufacturing a semiconductor device according to the third embodiment includes a mounting step of applying the semiconductor wafer onto the pressure-sensitive adhesive layer 33 of the pressure-sensitive adhesive sheet 30, a testing step of the semiconductor wafer or the semiconductor chip, a dicing step of dicing the semiconductor wafer, and a pick-up step of picking up the semiconductor chip. With the pressure-sensitive adhesive sheet 30 according to the third embodiment, because a continuity testing step can be performed even in a condition where the semiconductor wafer is applied as described above, the continuity testing step may be performed on the semiconductor wafer before the dicing step. Further, because the pressure-sensitive adhesive sheet 30 according to the third embodiment has a function as the pressure-sensitive adhesive sheet for dicing as well, a semiconductor chip may be formed by dicing in a condition where the semiconductor wafer is applied, and then the continuity testing step may be performed on each semiconductor chip after the dicing step.

The above-described mounting step is performed by superposing the semiconductor wafer and the pressure-sensitive adhesive sheet 30 to each other so that the backside of the semiconductor wafer (the surface opposite the circuit forming surface) and the pressure-sensitive adhesive layer 33 side become the application surfaces and by performing pressing with pressing means such as a pressing roll. Further, the semiconductor wafer and the pressure-sensitive adhesive sheet 30 can be applied to each other by superposing them as described above in a container that is capable of being pressurized (such as an autoclave) and pressurizing the inside of the container. At this time, they may be bonded while applying pressure with the pressing means. Further, they can also be bonded in the same manner as described above in a vacuum chamber. The bonding temperature for bonding is not limited at all. However, it is preferably 20 to 80° C.

In the case of performing the continuity test of a semiconductor wafer 9 before the dicing step, this semiconductor wafer 9 is placed on a continuity testing stage 13 in a condition where the pressure-sensitive adhesive sheet 30 is applied (see FIG. 7(a)). The continuity testing stage 13 suctions and fixes the semiconductor wafer 9 with the pressure-sensitive adhesive sheet 30 in between. The suctioning and fixing can be performed reliably, for example, without generating an air leak at the peripheral edge portion of the pressure-sensitive adhesive sheet 30. This is because a portion of the pressure-sensitive adhesive sheet 30 contacting the continuity testing stage 13 is the support 31 and not the base film 1, and this support 31 is not a web shaped film, or the like Next, a conductive path is secured by contacting one of the terminals for the continuity test to a circuit forming surface (electrode) 15 of the semiconductor wafer 9 and by contacting another terminal to the pressure-sensitive adhesive layer 33. After that, a predetermined voltage is applied between the terminals, and the conduction of the circuit formed in the semiconductor wafer 9 is confirmed based on the resistance value.

The dicing step is a step of forming semiconductor chips by cutting (dicing) the semiconductor wafer 9. The dicing is performed according to a normal method from the circuit surface side of the semiconductor wafer, and a known method may be used such as blade dicing, laser dicing, plasma dicing, and breaking. Further, a cutting method referred to as a full-cut method that cuts into to the pressure-sensitive adhesive sheet 30 may be adopted as the cutting method. In the third embodiment, because the conductive path is secured between the base film 1 and the pressure-sensitive adhesive layer 33 of the pressure-sensitive adhesive sheet 30, the continuity testing step on a semiconductor chip that is described later can be performed even in the case where the pressure-sensitive adhesive layer 33 is completely cut and a portion of the base film 1 is cut. The dicing apparatus used in the present step is not particularly limited, and a conventional known apparatus may be used.

In the case of performing the continuity test on the semiconductor chip 11 after the dicing step, each semiconductor chip 11 is placed on the continuity testing stage 13 in a condition where each semiconductor chip 11 is applied onto the pressure-sensitive adhesive sheet 30 (see FIG. 7(b)). Next, the conductive path is secured by contacting one of the terminals for the continuity test to a circuit forming surface (electrode) 15 of each semiconductor chip 11 and by contacting another terminal to the pressure-sensitive adhesive layer 33. After that, a predetermined voltage is applied between the terminals, and the conduction of each semiconductor chip 11 is confirmed based on the resistance value. Moreover, in the case where the pressure-sensitive adhesive layer 33 is completely cut in the dicing step, the other terminal is contacted to the continuity testing stage 13. Because the pressure-sensitive adhesive sheet 30 has a structure in which the conductive path is secured between the base film 1 and the pressure-sensitive adhesive layer 33, the continuity test becomes possible even when the pressure-sensitive adhesive layer 33 is completely cut and a portion of the base film 1 is cut into.

The pick-up step is performed for peeling the semiconductor chip 11 that is bonded and fixed to the pressure-sensitive adhesive sheet 30. The method of picking up is not particularly limited, and various conventionally known methods may be adopted. Examples thereof include a method of thrusting an individual semiconductor chip 11 from the side of the pressure-sensitive adhesive sheet 30 with a needle and picking up the thrust semiconductor chip 11 with a pick-up apparatus.

In the case of using the pressure-sensitive adhesive sheet 30 having a radiation curing type pressure-sensitive adhesive layer or a heat peeling type pressure-sensitive adhesive layer, radiation irradiation or a heat treatment may be carried out on the pressure-sensitive adhesive layer 33. In this manner, the adherability is lowered, and picking up is facilitated. In the case of a radiation curing type pressure-sensitive adhesive layer 33, conditions such as radiation intensity and a radiation time for radiation irradiation are not particularly limited, and they may be appropriately set as needed. Further, in the case of a heat peeling type pressure-sensitive adhesive layer 33, when heated, the pressure-sensitive adhesive layer 33 expands due to the heat foaming component or the heat expanding component and the adhesion area with the semiconductor chip 11 can be remarkably reduced. In this manner, the adhesive strength of the pressure-sensitive adhesive sheet 30 with respect to the semiconductor chip decreases, and it becomes easy to peel the pressure-sensitive adhesive sheet 30 from the semiconductor chip 11. As a result, the picking up becomes possible without causing damage on the semiconductor chip 11. The heating conditions such as the heating temperature and the heating time in the case of performing the heat treatment are not particularly limited, and they may be appropriately set as needed.

EXAMPLE

Preferred examples of this invention are described for illustrative purpose in detail below. However, the materials, the compounding amount, and the like described in the examples are merely illustrative and not for the purpose of limiting the scope of this invention as long as there is no particularly restrictive description.

Example 1

[Base Film]

A conductive fiber base material manufactured by Seiren Co., Ltd. (trade name SUI-40-20047, thickness 82 μm, mesh type, aperture 40%) was used as the base film. Further, the surface resistivity of this base material was $6.6 \times 10^{-2}$ Ω/□ and the volume resistivity was $5.3 \times 10^{-4}$ Ω·cm.

[Preparation of the Pressure-Sensitive Adhesive]

A solution containing an acrylic polymer having a number average molecular weight of 800,000 was obtained by copolymerizing methyl acrylate 70 parts by weight, butyl acrylate 30 parts by weight, and acrylic acid 5 parts by weight in ethyl acetate. An ultraviolet-ray curing-type pressure-sensitive adhesive solution was obtained by adding a urethane oligomer 50 parts by weight containing 6 unsaturated bonds in a molecule (trade name "UV-1700B", manufactured by The Nippon Synthetic Chemical Industry Co., Ltd.), a photopolymerization initiator (trade name "IRGACURE 651", manufactured by Ciba Specialty Chemicals) 3 parts by weight, and a polyisocyanate compound (trade name "Coronate L", manufactured by Nippon Polyurethane Industry) 0.2 part by weight into this solution.

[Production of Pressure-Sensitive Adhesive Sheet for Dicing]

An ultraviolet-ray curing-type pressure-sensitive adhesive layer having a thickness of 20 μm was formed by applying the conductive pressure-sensitive adhesive solution prepared above onto a release-treated surface of a polyester separator having a thickness of 50 μm that was release-treated for heating and crosslinking at 80° C. for 10 minutes. The tensile modulus of the pressure-sensitive adhesive layer at this time was 0.09 MPa. Then, this pressure-sensitive adhesive layer was applied to the base film, and an ultraviolet-ray curing-type pressure-sensitive adhesive sheet for dicing was produced. At this time, the pressure-sensitive adhesive sheet was pressed so that a portion of the conductive fibers in the base film is exposed from the surface of the pressure-sensitive adhesive layer. At this time, the pressing strength was 0.1 MPa, and the application temperature was 50° C.

Example 2

A pressure-sensitive adhesive sheet for dicing according to the present example was produced in the same way as the above-described Example 1 except that SU-10-33 (thickness 62 μm, mesh type, aperture 22%) manufactured by Seiren Co., Ltd. was used as the base film in the present example. Moreover, the surface resistivity of the base film in the present example was $3.7 \times 10^{-2}$ Ω/□, and the volume resistivity was $1.8 \times 10^{-4}$ Ω·cm.

Example 3

A pressure-sensitive adhesive sheet for dicing according to the present example was produced in the same way as the above-described Example 1 except that SU-4G-13227 (thickness 60 μm, mesh type, aperture 72%) manufactured by Seiren Co., Ltd. was used as the base film in the present example. Moreover, the surface resistivity of the base film in the present example was $2.9 \times 10^{-1}$ Ω/□, and the volume resistivity was $1.2 \times 10^{-3}$ Ω·cm.

Example 4

A pressure-sensitive adhesive sheet for dicing according to the present example was produced in the same way as the above-described Example 1 except that the thickness of the pressure-sensitive adhesive layer was changed to 10 μm in the present example.

Example 5

A pressure-sensitive adhesive sheet for dicing according to the present example was produced in the same way as the above-described Example 1 except that the content of the polyisocyanate compound was changed to 1 part by weight and the pressure-sensitive adhesive layer having a tensile modulus of 0.15 MPa was formed in the present example.

Comparative Example 1

A pressure-sensitive adhesive layer having a tensile modulus of 0.21 MPa was formed in the same way as Example 1 except that the content of the polyisocyanate compound was changed to 1.5 parts by weight. Furthermore, a pressure-sensitive adhesive sheet for dicing according to the present comparative example was produced by applying the pressure-sensitive adhesive layer to the base film in the same way as Example 1.

Reference Example 1

A pressure-sensitive adhesive sheet for dicing according to the present example was produced in the same way as the above-described Example 1 except that Sui-10-18W (thickness 90 μm, mesh type, aperture 2%) manufactured by Seiren Co., Ltd. was used as the base film in the present example. Moreover, the surface resistivity of the base film in the present example was $2.4 \times 10^{-2}$ Ω/□, and the volume resistivity was $2.1 \times 10^{-4}$ Ω·cm.

(Measurement of the Number Average Molecular Weight)

The number average molecular weight of the compounded acrylic polymer was measured with the following method. The number average molecular weight was measured with a polystyrene conversion by dissolving the acrylic polymer into THF at 0.1 wt % and using a GPC (gel permeation chromatography). The detailed measurement conditions were as follows.

GPC apparatus: HLC-8120GPC manufactured by Tosoh Corporation
Column: $(GMH_{HR}-H)+(GMH_{HR}-H)+(G2000H_{HR})$ manufactured by Tosoh Corporation
Flow rate: 0.8 ml/min
Concentration: 0.1 wt %
Injection amount: 100 μl
Column temperature: 40° C.
Eluent: THF (Surface Observation of the Pressure-Sensitive Adhesive Layer)

Whether the conductive fibers constituting the base film are exposed or not was checked by peeling the separators of the pressure-sensitive adhesive sheets for dicing obtained in Examples 1 to 5, Comparative Example 1, and Reference Example 1 and by observing the surface conditions of the pressure-sensitive adhesive layers using an optical microscope and a scanning electron microscope. A photograph of the surface condition of the pressure-sensitive adhesive layer of the pressure-sensitive adhesive sheet in Example 1 that is taken by an optical microscope is shown in FIG. 4(a), and a photograph that is taken by a scanning electron microscope is shown in FIG. 4(b). FIG. 4(b) shows that the intersecting portions of the conductive fibers of the base film are exposed from the surface of the pressure-sensitive adhesive layer.

(Aperture)

The aperture was calculated by the above-described method.

(Conductivity)

The conductivity of the surface of the pressure-sensitive adhesive layer was evaluated by peeling a separator from the pressure-sensitive adhesive sheet for testing and the like that were obtained in the examples 1 to 5, comparative Example 1, and the reference example 1. The dicing process was performed solely with the pressure-sensitive adhesive sheet, and conditions were set such that each base film of all pressure-sensitive adhesive sheets was cut to a depth half the thickness. The conductivity evaluation was performed according to JIS K7194 using Lorester MP MCP-T350 manufactured by Mitsubishi Chemical Corporation, and the surface resistivity and the volume resistivity of the pressure-sensitive adhesive layer in the pressure-sensitive adhesive sheet were obtained. The calculation of the surface resistivity and the volume resistivity was performed based on a resistivity correction factor RCF of 4.532.

(Peeling-Off Adhesive Strength)

The pressure-sensitive adhesive sheets for testing obtained in the examples 1 to 5, comparative Example 1, and the reference example 1 were cut into rectangular strips having 20 mm width and were applied onto a silicon mirror wafer surface (manufactured by Shin-Etsu Handotai Co. Ltd.; CZN<100> 2.5-3.5 (4 inch)) at 23±3° C. (room temperature). Next, it was placed still in a room temperature atmosphere for 30 minutes, and then the 90 degree peeling-off adhesive strength was measured in a thermostatic chamber at 23±3° C. (peeling point moving speed 300 mm/sec). Further, an ultraviolet ray was radiated (1500 mJ/cm$^2$) under a nitrogen atmosphere to the backside of the sheet, and the 90° peeling-off adhesive strength was measured in a thermostatic chamber of 23±3° C.

(Evaluation of Dicing)

A semiconductor wafer (6 inch) having a thickness of 100 μm and a backside that is ground was mounted onto the pressure-sensitive adhesive sheets for testing obtained in the examples 1 to 5, comparative Example 1, and the reference example 1 at a temperature of 23±3° C., and then dicing was performed under the following conditions. Whether chip flies during dicing and chipping and crack in the chip after dicing occurred or not was evaluated. In the evaluation, among 20 semiconductor chips, the case in which even chip fly or chipping and cracking of the chip occurred once was marked with x, and the case of no occurrence was marked with ○.

tinuously on 20 semiconductor chips, the case in which the success rate under the following conditions was 100% is marked with ○, and the case in which failure occurs even once is marked with x.

[Pick-Up Conditions]

Pick-up apparatus: CPS-100 manufactured by NES Machinery, Number of needles: 4, pulling down amount 6 mm, thrusting amount: 400 μm, thrusting speed: 80 mm/sec.

(Result)

As understood from the following Table 1, the surface resistivity of all the pressure sensitive adhesive layers in the pressure-sensitive adhesive sheets of Examples 1 to 5 was 5 Ω/□ or less, and the volume resistivity was $1\times10^{-1}$ Ω·cm or less. That is, a conductive path was formed between each of the pressure-sensitive adhesive sheets and the base films according to each example, and it was confirmed that the continuity test is possible before and after the dicing step. Further, in the pressure-sensitive adhesive sheets of Examples 1 to 5, chip fly during dicing, and chipping and cracking of the chip were not generated, and an extremely good dicing property was shown. Furthermore, all semiconductor chips could be picked up favorably, and an excellent pick-up property was also confirmed.

On the other hand, because a conductive path could not be secured in the pressure-sensitive adhesive sheet in Comparative Example 1, both the surface resistivity and the volume resistivity were over the measurement limit. As a result, the continuity test on the semiconductor wafer and the semiconductor chip in these pressure-sensitive adhesive sheets could not be performed in a condition where the pressure-sensitive adhesive sheets were applied.

TABLE 1

| Sample | Aperture (%) | Thickness of Pressure-Sensitive Adhesive Layer (μm) | Tensile Modulus (MPa) | Whether There is Exposure of Base Material | Surface Resistivity (Ω/□) | Volume Resistivity (Ω·cm) | Adhesive Strength (N/20 mm) | | Dicing Property | Pick-up Property |
|---|---|---|---|---|---|---|---|---|---|---|
| | | | | | | | Before UV | After UV | | |
| Example 1 | 40 | 20 | 0.05 | Yes | 1.9E−01 | 1.5E−03 | 1.5 | 0.04 | ○ | ○ |
| Example 2 | 22 | 20 | 0.05 | Yes | 4.9E−01 | 2.5E−03 | 2.5 | 0.08 | ○ | ○ |
| Example 3 | 72 | 20 | 0.09 | Yes | 1.2 | 5.0E−03 | 1.6 | 0.10 | ○ | ○ |
| Example 4 | 40 | 10 | 0.05 | Yes | 1.4E−01 | 6.4E−04 | 1.1 | 0.04 | ○ | ○ |
| Example 5 | 40 | 20 | 0.15 | Yes | 2.1E | 1.7E−02 | 0.7 | 0.06 | ○ | ○ |
| Reference Example 1 | 2 | 20 | 0.05 | Yes | 8.1 | 4.9E−2 | 3.2 | 3.3 | x | Impossible to Pick Up |
| Comparative Example 1 | 40 | 20 | 0.21 | No | Over Measurement | Over Measurement | 0.5 | 0.03 | ○ | ○ |

[Dicing Conditions]

Dicer: DFD-651 manufactured by DISCO Corporation, Blade: 27HECC manufactured by DISCO Corporation, Blade rotation speed: 35000 rpm, Dicing speed: 50 mm/sec, and Dicing size: 10 mm×10 mm.

The dicing was conducted to a cutting depth that allows a portion of the base film to be cut.

(Picking Up)

The pick-up property was evaluated based on whether the semiconductor chip after dicing can be peeled from each pressure-sensitive adhesive sheet. Specifically, the expanding step was performed to provide a predetermined space between chips by radiating (1500 mJ/cm$^2$) an ultraviolet ray under a nitrogen atmosphere to the backside of the pressure-sensitive adhesive sheet after dicing and stretching it out. Furthermore, the evaluation of the pick-up property was performed by picking up the semiconductor chip with a thrusting method using a needle from the base film side of each pressure-sensitive adhesive sheet. Picking up was performed con- Example 6

[Base Film]

A conductive fiber base material manufactured by Seiren Co., Ltd. (trade name SUI-40-20047, thickness 82 μm, mesh type, aperture 40%) was used as the base film. Further, the surface resistivity of this base film was $6.6\times10^{-2}$ Ω/□ and the volume resistivity was $5.3\times10^{-4}$ Ω·cm.

[Preparation of the Pressure-Sensitive Adhesive]

A solution containing an acrylic polymer having a number average molecular weight of 800,000 was obtained by copolymerizing methyl, acrylate 70 parts by weight, butyl acrylate 30 parts by weight, and acrylic acid 5 parts by weight in ethyl acetate. An ultraviolet-ray curing-type pressure-sensitive adhesive solution was obtained by adding a urethane oligomer 50 parts by weight containing 6 unsaturated bonds in a molecule (trade name "UV-1700B", manufactured by The Nippon Synthetic Chemical Industry Co., Ltd.), a photopolymerization initiator (trade name "IRGACURE 651", manufactured by Ciba Specialty Chemicals) 3 parts by weight, and a polyisocyanate compound (trade name "Coronate L", manufactured by Nippon Polyurethane Industry) 1.5 parts by weight into this solution. A conductive pressure-sensitive adhesive solution was produced by adding nickel powder manufactured by Inco Special Products (trade name Type 123, a spike shape, particle diameter 3 to 7 μmφ) 10 parts by weight into this pressure-sensitive adhesive solution as the conductive particles.

[Production of Pressure-Sensitive Adhesive Sheet for Dicing]

An ultraviolet-ray curing-type pressure-sensitive adhesive layer having a thickness of 10 μm was formed by applying the conductive pressure-sensitive adhesive solution prepared above onto a release-treated surface of a polyester separator having a thickness of 50 μm that was release-treated, for heating and crosslinking at 80° C. for 10 minutes. Then, this pressure-sensitive adhesive layer was applied to the conductive fiber base material, and an ultraviolet-ray curing-type pressure-sensitive adhesive sheet for dicing was produced.

Example 7

A pressure-sensitive adhesive sheet for dicing according to the present example was produced in the same way as the above-described Example 6 except that the content of the conductive particles was changed to 50 parts by weight in the present example.

Example 8

A pressure-sensitive adhesive sheet for dicing according to the present example was produced in the same way as the above-described Example 6 except that the content of the conductive particles was changed to 500 parts by weight in the present example.

Example 9

A pressure-sensitive adhesive sheet for dicing according to the present example was produced in the same way as the above-described Example 6 except that 1 part by weight of carbon black manufactured by Mikuni Color (trade name MH1 BLACK #273) is used instead of 10 parts by weight of nickel powder as the conductive particles in the present example.

Reference Example 2

A pressure-sensitive adhesive sheet for dicing according to the present example was produced in the same way as the above-described Example 6 except that the content of the conductive particles was changed to 1000 parts by weight in the present example.

Comparative Example 2

A pressure-sensitive adhesive sheet for dicing according to the present comparative example was produced in the same way as the above-described Example 6 except that the conductive particles were not used in the present example.

Comparative Example 3

A pressure-sensitive adhesive sheet for dicing according to the present comparative example was produced in the same way as the above-described Example 6 except that a polyester film manufactured by Toray Industries Inc. (trade name Lumirror S10, thickness 50 μm) was used as the base film in the present comparative example. Moreover, both of the surface resistivity and the volume resistivity of the base film in the present comparative example were over the measurement limit.

Comparative Example 4

A pressure-sensitive adhesive sheet for dicing according to the present comparative example was produced in the same way as the above-described Example 6 except that an aluminum-deposited polyester film manufactured by Toray Advanced Film Co., Ltd. (trade name Metalumy TS, thickness 50 was used as the base film in the present comparative example. Moreover, the surface resistivity of the base film in the present comparative example was 1.5 Ω/□ and the volume resistivity was $7.3 \times 10^{-3}$ Ω·cm. Further, an Al-deposited layer of the base film was also cut in the dicing step described later.

Comparative Example 5

A pressure-sensitive adhesive sheet for dicing according to the present comparative example was produced in the same way as the above-described Example 6 except that a rolled copper foil manufactured by Nikko Materials Co., Ltd. (thickness 50 μm) was used as the base film in the present comparative example. Moreover, the surface resistivity of the base film in the present comparative example was $6.4 \times 10^{-3}$ Ω/□ and the volume resistivity was $1.8 \times 10^{-6}$ Ω·cm.

(Measurement of the Number Average Molecular Weight)

The number average molecular weight of the compounded acrylic polymer was measured with the following method. The number average molecular weight was measured with a polystyrene conversion by dissolving the acrylic polymer into THF at 0.1 wt % and using a GPC (gel permeation chromatography). The detailed measurement conditions were as follows.

GPC apparatus: HLC-8120GPC manufactured by Tosoh Corporation

Column: $(GMH_{HR}-H)+(GMH_{HR}-H)+(G2000H_{HR})$ manufactured by Tosoh Corporation Flow rate: 0.8 ml/min Concentration: 0.1 wt %

Injection amount: 100 μl

Column temperature: 40° C.

Eluent: THF (Conductivity)

The conductivity of the surface of the pressure-sensitive adhesive before and after the dicing treatment in the pressure-sensitive adhesive sheets for dicing obtained in Examples 6 to 9, Comparative Examples 2 to 5, and Reference Example 2 was evaluated in the same way as described above.

(Peeling-Off Adhesive Strength)

The peeling-off adhesive strength of the pressure-sensitive adhesive layers in the pressure-sensitive adhesive sheets for dicing obtained in Examples 6 to 9, Comparative Examples 2 to 5, and Reference Example 2 was measured in the same way as described above.

(Evaluation of Dicing)

A semiconductor wafer (6 inch) having a thickness of 100 μm and a backside that is ground was mounted onto the pressure-sensitive adhesive sheets for testing obtained in the examples 6 to 9, comparative Example 2, and the reference example 2 at a temperature of 23±3° C., and then dicing was performed under the following conditions. Whether chip flies during dicing and chipping and crack in the chip after dicing occurred or not was evaluated. In the evaluation, among 20 semiconductor chips, the case in which even chip fly or chipping and cracking of the chip occurred once was marked with x, and the case of no occurrence was marked with ○.

[Dicing Conditions]

Dicer: DFD-651 manufactured by DISCO Corporation,
Blade: 27HECC manufactured by DISCO Corporation,
Blade rotation speed: 35000 rpm, Dicing speed: 50 mm/sec, and Dicing size: 10 mm×10 mm.

The dicing was conducted to a cutting depth that allows a portion of the base film to be cut.

The dicing was conducted to a cutting depth that allows a portion of the base film to be cut. For the pressure-sensitive adhesive sheet of Comparative Example 3, the dicing was performed to an extent that the Al-deposited layer of the base film is cut.

(Result)

As understood from the following Table 2, the surface resistivity of all of the pressure sensitive adhesive layers in the pressure-sensitive adhesive sheets in Examples 6 to 9 was 5 Ω/□ or less, and the volume resistivity was $1 \times 10^{-1}$ Ω·cm or less. That is, a conductive path was formed between each of the pressure-sensitive adhesive sheets and the base films according to each example, and it was confirmed that the continuity test is possible before and after the dicing step. Furthermore, in the pressure-sensitive adhesive sheets in Examples 6 to 9, chip fly during dicing, and chipping and cracking of the chip were not generated, and an extremely good dicing property was shown.

On the other hand, because the pressure-sensitive adhesive layer in the pressure-sensitive adhesive sheet in Comparative Example 2 does not have conductivity and the base film does not have conductivity in the pressure-sensitive adhesive sheet of Comparative Example 3, both the surface resistivity and the volume resistivity were over the measurement limit. As a result, the continuity test on the semiconductor wafer or the semiconductor chip in these pressure-sensitive adhesive sheets could not be performed in a condition where the pressure-sensitive adhesive sheets were applied. Because the Al-deposited layer was cut by dicing in the pressure-sensitive adhesive sheet of Comparative Example 4, the conductive path after dicing could not be secured. Further, because the base film was broken when dicing and after dicing in the pressure sensitive adhesive sheet in Comparative Example 5, evaluation could not be made.

TABLE 2

| Sample | Base Film | Conductive Particles | Compounding Amount of Conductive Particles (Parts) | Before Dicing Surface Resistivity (Ω/□) | Before Dicing Volume Resistivity (Ωcm) | After Dicing Surface Resistivity (Ω/□) | After Dicing Volume Resistivity (Ωcm) | Adhesive Strength (N/20 mm) Before UV | Adhesive Strength (N/20 mm) After UV | Dicing Property |
|---|---|---|---|---|---|---|---|---|---|---|
| Example 6 | Conductive Fibers | Ni | 10 | 4.0E−1 | 1.2E−3 | 4.6E−1 | 1.4E−3 | 1.9 | 0.03 | ○ |
| Example 7 | Conductive Fibers | Ni | 50 | 6.9E−2 | 2.1E−4 | 3.6E−2 | 1.1E−4 | 1.2 | 0.04 | ○ |
| Example 8 | Conductive Fibers | Ni | 500 | 5.0E−2 | 1.5E−4 | 5.4E−2 | 1.6E−4 | 0.5 | 0.01 | ○ |
| Example 9 | Conductive Fibers | CB | 1 | 5.9E−1 | 1.8E−3 | 1.1 | 3.2E−3 | 2.1 | 0.03 | ○ |
| Comparative Example 2 | Conductive Fibers | — | 0 | Over Measurement | Over Measurement | Over Measurement | Over Measurement | 2.2 | 0.04 | ○ |
| Comparative Example 3 | PET | Ni | 50 | Over Measurement | Over Measurement | Over Measurement | Over Measurement | 2.6 | 0.03 | ○ |
| Comparative Example 4 | Al-deposited PET | Ni | 50 | 4.8 | 1.4E−2 | Over Measurement | Over Measurement | 2.5 | 2.5 | ○ |
| Comparative Example 5 | Cu Foil | Ni | 50 | 6.9E−2 | 2.1E−4 | Evaluation Impossible, Tape Broken | Evaluation Impossible, Tape Broken | 3.1 | 3.3 | x Tape Broken |
| Reference Example 2 | Conductive Fibers | Ni | 1000 | 4.9E−2 | 1.5E−4 | 5.0E−2 | 1.5E−4 | 0 | 0 | x Chip Fly |

Example 10

[Base Film]

A conductive fiber base material manufactured by Seiren Co., Ltd. (trade name SUI-40-20047, thickness 82 μm, mesh type, aperture 40%) was used as the base film. Further, the surface resistivity of this base material was $6.6 \times 10^{-2}$ Ω/□ and the volume resistivity was $5.3 \times 10^{-4}$ Ω·cm.

[Preparation of the Pressure-Sensitive Adhesive]

A solution containing an acrylic polymer having a number average molecular weight of 800,000 was obtained by copolymerizing methyl acrylate 70 parts by weight, butyl acrylate 30 parts by weight, and acrylic acid 5 parts by weight in ethyl acetate. An ultraviolet-ray curing-type pressure-sensitive adhesive solution was obtained by adding a urethane oligomer 50 parts by weight containing 6 unsaturated bonds in a molecule (trade name "UV-1700B", manufactured by The Nippon Synthetic Chemical Industry Co., Ltd.), a photopolymerization initiator (trade name "IRGACURE 651", manufactured by Ciba Specialty Chemicals) 3 parts by weight, and a polyisocyanate compound (trade name "Coronate L", manufactured by Nippon Polyurethane Industry) 1.5 parts by weight into this solution. A conductive pressure-sensitive adhesive solution was produced by adding nickel powder manufactured by Inco Special Products (trade name Type 123, a spike shape, a particle diameter 3 to 7 μmφ) 10 parts by weight into this pressure-sensitive adhesive solution as the conductive particles.

[Production of Pressure-Sensitive Adhesive Sheet for Dicing]

An ultraviolet-ray curing-type pressure-sensitive adhesive layer having a thickness of 10 μm was formed by applying the conductive pressure-sensitive adhesive solution prepared above onto a release-treated surface of a polyester separator having a thickness of 50 μm that was release-treated, for heating and crosslinking at 80° C. for 10 minutes.

On the other hand, a pressure-sensitive adhesive layer having a thickness of 5 μm was formed by applying a pressure-sensitive adhesive solution that is constituted by adding Coronate L 2.0 parts by weight into the above-described acrylic polymer 100 parts by weight onto a release-treated surface of a polyester separator having a thickness of 50 μm that was release-treated, for heating and crosslinking at 80° C. for 10 minutes.

Then, the ultraviolet-ray curing-type pressure-sensitive adhesive layer was applied onto one surface of the base film, and the pressure-sensitive adhesive layer was applied onto the other surface. Furthermore, the separator on the pressure-sensitive adhesive layer side was peeled, and the adhesive layer was applied onto a soft vinyl chloride film (thickness 100 m, tensile modulus 330 MPa, maximum point elongation 250%) as a support. In this manner, the pressure-sensitive adhesive sheet for testing according to the present example was produced. The tensile modulus was tested at a temperature of 23±2° C., humidity of 50±5%, marked line interval distance and grip interval distance of 50 mm, tension in the length (MD) direction of the support, and at a speed of 300 mm/min. according to the tension testing method of JIS K7127 (a tension testing method for plastic films and sheets).

Example 11

In the present Example, an ultraviolet-ray curing-type pressure-sensitive adhesive layer having a thickness of 10 μm was formed on a release-treated surface of a polyester separator in the same way as the above-described Example 10. Then, the ultraviolet-ray curing-type pressure-sensitive adhesive layer was applied onto one surface of the base film, and a pressure-sensitive adhesive sheet (manufactured by Nitto Denko Corporation, trade name ELEP HOLDER NST-5170K, tensile modulus 220 MPa, maximum point elongation 980%) as the support was applied onto the other surface so that its pressure-sensitive adhesive layer side becomes an application surface. In this manner, the pressure-sensitive adhesive sheet for testing according to the present example was produced.

Example 12

In the present Example, an ultraviolet-ray curing-type pressure-sensitive adhesive layer having a thickness of 10 μm was formed on a release-treated surface of a polyester separator in the same way as the above-described Example 10. Then, the ultraviolet-ray curing-type pressure-sensitive adhesive layer was applied onto one surface of the base film, and a pressure-sensitive adhesive sheet (manufactured by Nitto Denko Corporation, trade name ELEP HOLDER DU-400SE, tensile modulus 160 MPa, maximum point elongation 880%) as the support was applied onto the other surface so that its pressure-sensitive adhesive layer side becomes an application surface. In this manner, the pressure-sensitive adhesive sheet for testing according to the present example was produced.

Example 13

In the present example, in the same way as Example 10, a sheet was produced in which the ultraviolet-ray curing-type pressure-sensitive adhesive layer was applied onto one surface of the base film and the pressure-sensitive adhesive layer was applied onto the other surface, and was processed into a label so as to have the same shape as the semiconductor wafer in a plan view. After that, the pressure-sensitive adhesive sheet for testing according to the present example was produced by peeling the separator and applying the adhesive sheet onto a soft vinyl chloride film (thickness 100 μm, tensile modulus 330 MPa, maximum point elongation 250%) as a support.

Example 14

In the present example, an ultraviolet-ray curing-type pressure-sensitive adhesive layer having a thickness of 10 μm was formed on a release-treated surface of a polyester separator in the same way as the above-described Example 11, and then, a sheet was produced in which the ultraviolet-ray curing-type pressure-sensitive adhesive layer was applied onto one surface of the base film. It was processed into a label so as to have the same shape as the semiconductor wafer in a plan view. Furthermore, a pressure-sensitive adhesive sheet (manufactured by Nitto Denko Corporation, trade name ELEP HOLDER NBD-5170K, tensile modulus 220 MPa, maximum point elongation 960%) as a support was applied onto the other surface of the base film so that its pressure-sensitive adhesive layer side becomes an application surface. In this manner, the pressure-sensitive adhesive sheet for testing according to the present example was produced.

Comparative Example 6

In the present comparative example, the pressure-sensitive adhesive sheet for testing according to the present comparative example was produced by forming an ultraviolet-ray curing-type pressure-sensitive adhesive layer on the base sheet in the same way as the above-described Example 10.

Comparative Example 7

The pressure-sensitive adhesive sheet for testing according to the present comparative example was produced in the same way as the above-described Example 10 except that an aluminum-deposited polyester film manufactured by Toray Advanced Film Co., Ltd. (trade name Metalumy TS, thickness 25 μm) was used as the base film in the present comparative example. Moreover, the surface resistivity of the base film in the present comparative example was 1.5 Ω/□ and the volume resistivity was $7.3 \times 10^{-3}$ Ω·cm.

Comparative Example 8

The pressure-sensitive adhesive sheet for dicing according to the present comparative example was produced in the same way as the above-described Example 10 except that a soft vinyl chloride film (thickness 80 μm) was used as the base film in the present comparative example. Moreover, the surface resistivity and the volume resistivity of the base film in the present comparative example were over the measurement limit.

(Number Average Molecular Weight)

The measurement of the number average molecular weight of the synthesized acrylic polymer was performed in the same manner as described above.

(Conductivity)

The conductivity of the surface of the pressure-sensitive adhesive before and after the dicing treatment in the pressure-sensitive adhesive sheets for dicing obtained in Examples 10 to 14, and Comparative Examples 6 to 8 was evaluated in the same way as described above.

(Peeling-Off Adhesive Strength)

The peeling-off adhesive strength of the pressure-sensitive adhesive layers in the pressure-sensitive adhesive sheets for dicing obtained in Examples 10 to 14, and Comparative Examples 6 to 8 was measured in the same way as described above.

(Evaluation of Dicing)

A semiconductor wafer (6 inch) having a thickness of 100 μm and a backside that is ground was mounted onto the pressure-sensitive adhesive sheets for testing obtained in the examples 10 to 14, and comparative Examples 6 to 8 at a temperature of 23±3° C., and then dicing was performed under the following conditions. Whether chip flies during dicing and chipping and crack in the chip after dicing occurred or not was evaluated. In the evaluation, among 20 semiconductor chips, the case in which even chip fly or chipping and cracking of the chip occurred once was marked with ×, and the case of no occurrence was marked with ○.

[Dicing Conditions]

Dicer: DFD-651 manufactured by DISCO Corporation, Blade: 27HECC manufactured by DISCO Corporation, Blade rotation speed: 35000 rpm, Dicing speed: 50 mm/sec, and Dicing size: 10 mm×10 mm.

The dicing was conducted to a cutting depth that allows a portion of the base film to be cut.

The dicing was conducted to a cutting depth that allows a portion of the base film to be cut. For the pressure-sensitive adhesive sheet of Comparative Example 3, the dicing was performed to an extent that the Al-deposited layer of the base film is cut.

(Picking Up)

The pick-up property was evaluated based on whether the semiconductor chip after dicing can be peeled from each pressure-sensitive adhesive sheet. Specifically, the expanding step was performed to provide a predetermined space between chips by radiating (1500 mJ/cm$^2$) an ultraviolet ray under a nitrogen atmosphere from the backside of the pressure-sensitive adhesive sheet after dicing and stretching it out. Furthermore, the evaluation of the pick-up property was performed by picking up the semiconductor chip with a thrusting method using a needle from the base film side of each pressure-sensitive adhesive sheet. Picking up was performed continuously on 50 semiconductor chips, and the number of the semiconductor wafers in which the picking up was successfully carried out was counted.

[Pick-Up Conditions]

Pick-up apparatus; NEC Machinery-100, Number of pins: 4, interval of pins: 3.5×3.5 mm, curvature of the pin tip: 0.250 mm, pin thrusting amount: 0.50 mm, suction maintaining time: 0.2 sec, expanding amount: 3 mm (Result)

As understood from the following Table 3, a conductive path was formed between any of the pressure-sensitive adhesive sheets according to Examples 10 to 14 and the base film, and it was confirmed that the continuity test is possible before and after the dicing step. Furthermore, chip fly during dicing, and chipping and cracking of the chip were not generated, and an extremely good dicing property was shown. In addition, the picking up was successfully carried out for all the semiconductor chips, and a good pick-up property was shown.

On the other hand, because the pressure-sensitive adhesive sheet in Comparative Example 6 does not have a support, the pick-up property was at 10%. Further, because the Al-deposited layer was cut by dicing in the pressure-sensitive adhesive sheet in Comparative Example 7, the conductive path after dicing could not be secured. Furthermore, because the base film did not have conductivity in the pressure-sensitive adhesive sheet of Comparative Example 8, the surface resistivity and the volume resistivity were over the measurement limit. As a result, the continuity test on the semiconductor wafer or the semiconductor chip in these pressure-sensitive adhesive sheets could not be performed in a condition where the pressure-sensitive adhesive sheet is applied.

TABLE 3

| Sample | Base Film | Label Process | Support | Before Dicing Surface Resistivity ($\Omega/\square$) | Before Dicing Volume Resistivity ($\Omega$cm) | After Dicing Surface Resistivity ($\Omega/\square$) | After Dicing Surface Resistivity ($\Omega/\square$) | Adhesive Strength (N/20 mm) Before UV | Adhesive Strength (N/20 mm) After UV | Dicing Property | Pick-up property |
|---|---|---|---|---|---|---|---|---|---|---|---|
| Example 10 | Conductive Fibers | No | Vinyl chloride | 4.0E−1 | 1.2E−3 | 4.6E−1 | 1.4E−3 | 2.3 | 0.03 | ○ | 100 |
| Example 11 | Conductive Fibers | No | Pressure-Sensitive Adhesive Sheet | 4.2E−1 | 1.4E−3 | 4.4E−1 | 1.2E−3 | 2.5 | 0.04 | ○ | 100 |
| Example 12 | Conductive Fibers | No | Pressure-Sensitive Adhesive Sheet | 4.1E−1 | 1.3E−3 | 4.3E−1 | 1.1E−3 | 2.2 | 0.03 | ○ | 100 |
| Example 13 | Conductive Fibers | Yes | Vinyl chloride | 4.0E−1 | 1.2E−3 | 4.6E−1 | 1.4E−3 | 2.3 | 0.01 | ○ | 100 |
| Example 14 | Conductive Fibers | Yes | Pressure-Sensitive Adhesive Sheet | 4.2E−1 | 1.4E−3 | 4.4E−1 | 1.2E−3 | 2.5 | 0.03 | ○ | 100 |
| Comparative Example 6 | Conductive Fibers | No | — | 4.0E−1 | 1.2E−3 | 4.6E−1 | 1.4E−3 | 2.0 | 0.03 | ○ | 10 |
| Comparative Example 7 | Al-deposited PET | No | Vinyl chloride | 4.8 | 1.4E−2 | Over Measurement | Over Measurement | 2.5 | 0.03 | ○ | 100 |
| Comparative Example 8 | Vinyl chloride | No | — | Over Measurement | Over Measurement | Over Measurement | Over Measurement | 1.9 | 0.04 | ○ | 100 |

The invention claimed is:

1. A pressure-sensitive adhesive sheet comprising: a base film; and a pressure-sensitive adhesive layer provided on the base film, wherein
the base film contains a conductive fiber and an electrically conductive path is formed between the pressure-sensitive adhesive layer and the base film.

2. The pressure-sensitive adhesive sheet according to claim 1, wherein a portion of the conductive fiber constituting the base film is exposed from a surface of the pressure-sensitive adhesive layer, and the electrically conductive path is formed between the surface of the pressure-sensitive adhesive layer and the base film.

3. The pressure-sensitive adhesive sheet according to claim 2, wherein the aperture of the base film is 10% or more.

4. The pressure-sensitive adhesive sheet according to claim 2, wherein the tensile modulus of the pressure-sensitive adhesive layer before being formed on the base film is 0.2 MPa or less.

5. The pressure-sensitive adhesive sheet according to claim 1, wherein a conductive particle is contained in the pressure-sensitive adhesive layer.

6. The pressure-sensitive adhesive sheet according to claim 5, wherein the content of the conductive particle is in a range of 1 to 500 parts by weight with respect to a base polymer 100 parts by weight.

7. The pressure-sensitive adhesive sheet according to claim 1, wherein the surface resistivity of the pressure-sensitive adhesive layer is 5 Ω/□ or less.

8. The pressure-sensitive adhesive sheet according to claim 1, wherein the surface resistivity of the base film is 1 Ω/□ or less.

9. The pressure-sensitive adhesive sheet according to claim 1, wherein the pressure-sensitive adhesive layer is a radiation curing-type pressure-sensitive adhesive layer.

10. The pressure-sensitive adhesive sheet according to claim 1, wherein the base film and the pressure-sensitive adhesive layer are laminated one by one onto a support, and the tensile modulus of the support at 23° C. is 500 MPa or less.

11. The pressure-sensitive adhesive sheet according to claim 10, wherein a conductive particle is contained in the pressure-sensitive adhesive layer.

12. The pressure-sensitive adhesive sheet according to claim 10, wherein a portion of the conductive fiber is exposed from the surface of the pressure-sensitive adhesive layer.

13. The pressure-sensitive adhesive sheet according to claim 10, wherein the aperture of the base film is 10% or more.

14. The pressure-sensitive adhesive sheet according to claim 10, wherein another pressure-sensitive adhesive layer is provided between the support and the base film.

15. The pressure-sensitive adhesive sheet according to claim 10, wherein the support has a structure in which another pressure-sensitive adhesive layer is provided on a base material.

16. The pressure-sensitive adhesive sheet according to claim 10, wherein the maximum elongation of the support is 100% or more.

17. A method of manufacturing a semiconductor device comprising the steps of:
applying a semiconductor wafer onto the pressure-sensitive adhesive layer in the pressure-sensitive adhesive sheet according to claim 1 with a surface opposite a circuit forming surface as an application surface;
performing a continuity test on the semiconductor wafer through establishment of an electrical connection by placing the pressure-sensitive adhesive sheet onto a conductive testing stage in a condition where the semiconductor wafer is fixed and by contacting one connection terminal to the circuit forming surface of the semiconductor wafer and contacting another connection terminal to the pressure-sensitive adhesive layer or the continuity testing stage;
forming a semiconductor chip in a condition where at least a portion of the base film is left by dicing the semiconductor wafer from the circuit forming surface side; and
picking up the semiconductor chip from the pressure-sensitive adhesive sheet.

18. A method of manufacturing a semiconductor device comprising the steps of:
applying a dicing ring and a semiconductor wafer onto the pressure-sensitive adhesive layer in the pressure-sensitive adhesive sheet according to claim 1 with a surface opposite a circuit forming surface as an application surface;
forming semiconductor chips in a condition where at least a portion of the base film is left by dicing the semiconductor wafer from the circuit forming surface side;
performing a continuity test on the semiconductor chips through establishment of an electrical connection by placing the pressure-sensitive adhesive sheet onto a conductive testing stage in a condition where each semiconductor chip right after dicing is fixed and by contacting one connection terminal to the circuit forming surface of the semiconductor chip and contacting another connection terminal to the pressure-sensitive adhesive layer, the dicing ring, or the continuity testing stage; and
picking up the semiconductor chips from the pressure-sensitive adhesive sheet.

19. A method of manufacturing a semiconductor device comprising the steps of:
applying a semiconductor wafer onto the pressure-sensitive adhesive layer in the pressure- sensitive adhesive sheet according to claim 10 with a surface opposite a circuit forming surface as an application surface;
performing a continuity test on the semiconductor wafer through establishment of an electrical connection by placing the pressure-sensitive adhesive sheet onto a conductive testing stage in a condition where the semiconductor wafer is fixed and by contacting one connection terminal to the circuit forming surface of the semiconductor wafer and contacting another connection terminal to the pressure-sensitive adhesive layer;
forming a semiconductor chip in a condition where at least a portion of the base film is left by dicing the semiconductor wafer from the circuit forming surface side; and
picking up the semiconductor chip from the pressure-sensitive adhesive sheet.

20. The semiconductor device manufacturing method according to claim 19, wherein the base film and the pressure-sensitive adhesive layer having a shape, in plan view, similar to that of the semiconductor wafer are used as the pressure-sensitive adhesive sheet.

21. A method of manufacturing a semiconductor device comprising the steps of:
applying a semiconductor wafer onto the pressure-sensitive adhesive layer in the pressure- sensitive adhesive sheet according to claim 10 with a surface opposite a circuit forming surface as an application surface;
forming semiconductor chips in a condition where at least a portion of the base film is left by dicing the semiconductor wafer from the circuit forming surface side;
performing a continuity test on the semiconductor chips through establishment of an electrical connection by placing the pressure-sensitive adhesive sheet onto a conductive testing stage in a condition where each semiconductor chip right after dicing is fixed and by contacting one connection terminal to the circuit forming surface of the semiconductor chip and contacting another connection terminal to the pressure-sensitive adhesive layer; and picking up the semiconductor chips from the pressure-sensitive adhesive sheet.

22. The semiconductor device manufacturing method according to claim 21, wherein the base film and the pressure-sensitive adhesive layer having a shape, in plan view, similar to that of the semiconductor wafer are used as the pressure-sensitive adhesive sheet.

23. The pressure-sensitive adhesive sheet according to claim 1, wherein the base film is woven with the conductive fiber to thereby form a conductive path in a thickness direction and any direction within the surface of the base film.

* * * * *

UNITED STATES PATENT AND TRADEMARK OFFICE
CERTIFICATE OF CORRECTION

PATENT NO. : 8,048,690 B2
APPLICATION NO. : 12/513316
DATED : November 1, 2011
INVENTOR(S) : Yoshio Terada et al.

It is certified that error appears in the above-identified patent and that said Letters Patent is hereby corrected as shown below:

At Column 1, line 47, after "steps" insert --.--.

At Column 3, line 63, after "is" insert --,--.

At Column 10, line 65-66, please change "8-hydroxyethyl(meth)acrylate," to --8-hydroxyoctyl(meth)acrylate,--.

At Column 11, line 30, please change "method.," to --method,--.

At Column 12, line 38-39, please change "dipentaerythiritol" to --dipentaerythritol--.

At Column 13, line 10, please change "thioxanthene," to --thioxanthone,--.

At Column 13, line 16, please change "e,g.," to --e.g.,--.

At Column 22, line 42, please change "ITIS K7199" to --JIS K7194--.

At Column 25, line 29, after "like" insert --.--.

At Column 29, line 9 (Approx.), after "Co." insert --,--.

At Column 30, line 61, please change "methyl," to --methyl--.

At Column 35, line 40, please change "NST-" to --NBD- --.

At Column 36, line 25 (Approx.), please change "960%)" to --980%)--.

At Column 38, line 15, after "mm" insert --.--.

Signed and Sealed this
Twelfth Day of June, 2012

David J. Kappos
*Director of the United States Patent and Trademark Office*

CERTIFICATE OF CORRECTION (continued)
U.S. Pat. No. 8,048,690 B2

At Column 40, line 36, in Claim 19, please change "pressure- sensitive" to --pressure-sensitive--.

At Column 40, line 60 (Approx.), in Claim 21, please change "pressure- sensitive" to --pressure-sensitive--.